(12) United States Patent
Chuang et al.

(10) Patent No.: US 11,662,646 B2
(45) Date of Patent: May 30, 2023

(54) INSPECTION AND METROLOGY USING BROADBAND INFRARED RADIATION

(71) Applicant: KLA-Tencor Corporation, Milpitas, CA (US)

(72) Inventors: Yung-Ho Alex Chuang, Cupertino, CA (US); Vahid Esfandyarpour, San Jose, CA (US); John Fielden, Los Altos, CA (US); Baigang Zhang, San Jose, CA (US); Yinying Xiao Li, San Jose, CA (US)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 15/794,887

(22) Filed: Oct. 26, 2017

(65) Prior Publication Data

US 2018/0224711 A1    Aug. 9, 2018

Related U.S. Application Data

(60) Provisional application No. 62/454,805, filed on Feb. 5, 2017.

(51) Int. Cl.
*G01N 21/3563* (2014.01)
*G02F 1/39* (2006.01)
(Continued)

(52) U.S. Cl.
CPC ............ *G02F 1/39* (2013.01); *G01N 21/359* (2013.01); *G01N 21/3563* (2013.01); *G01N 21/8806* (2013.01); *G01N 21/9501* (2013.01); *G01N 21/956* (2013.01); *G02F 1/3551* (2013.01); *G02F 1/3556* (2013.01); *G02F 1/3558* (2013.01); *H01L 21/67253* (2013.01);
(Continued)

(58) Field of Classification Search
CPC ............ G01N 21/3554; G01N 21/314; G01N 33/346; G01N 21/3504; G01N 21/86
See application file for complete search history.

(56) References Cited

U.S. PATENT DOCUMENTS 4,999,014 A    3/1991   Gold et al.
5,181,080 A    1/1993   Fanton et al.
(Continued)

FOREIGN PATENT DOCUMENTS

TW    201511155 A    3/2015

OTHER PUBLICATIONS

International Search Report dated May 29, 2018 for PCT/US2018/016760.
(Continued)

*Primary Examiner* — David P Porta
*Assistant Examiner* — Mamadou Faye
(74) *Attorney, Agent, or Firm* — Suiter Swantz pc llo

(57) ABSTRACT

Systems and methods for measuring or inspecting semiconductor structures using broadband infrared radiation are disclosed. The system may include an illumination source comprising a pump source configured to generate pump light and a nonlinear optical (NLO) assembly configured to generate broadband IR radiation in response to the pump light. The system may also include a detector assembly and a set of optics configured to direct the IR radiation onto a sample and direct a portion of the IR radiation reflected and/or scattered from the sample to the detector assembly.

23 Claims, 13 Drawing Sheets

US 11,662,646 B2
Page 2

(51) Int. Cl.
*G01N 21/88* (2006.01)
*G01N 21/956* (2006.01)
*G01N 21/359* (2014.01)
*G01N 21/95* (2006.01)
*G02F 1/355* (2006.01)
*H01L 21/67* (2006.01)
*G01N 21/21* (2006.01)

(52) U.S. Cl.
CPC ............ *G01N 2021/213* (2013.01); *G01N 2021/3568* (2013.01); *G01N 2021/8848* (2013.01)

(56) References Cited

U.S. PATENT DOCUMENTS

| | | | |
|---|---|---|---|
| 5,608,526 | A | 3/1997 | Piwonka-Corle et al. |
| 5,877,859 | A | 3/1999 | Aspnes et al. |
| 5,999,310 | A | 12/1999 | Shafer et al. |
| 6,297,880 | B1 | 10/2001 | Rosencwaig et al. |
| 6,429,943 | B1 | 8/2002 | Opsal et al. |
| 6,587,282 | B1 * | 7/2003 | Wang ............ G02B 9/14 359/661 |
| 7,369,235 | B1 * | 5/2008 | Janik ............ G01B 11/0641 356/369 |
| 7,379,173 | B2 | 5/2008 | Fairley et al. |
| 7,525,649 | B1 | 4/2009 | Leong et al. |
| 9,470,639 | B1 | 10/2016 | Zhuang et al. |
| 2002/0176454 | A1 | 11/2002 | Arbore et al. |
| 2007/0002465 | A1 | 1/2007 | Chuang et al. |
| 2008/0144025 | A1 | 6/2008 | Vollrath et al. |
| 2009/0122816 | A1 | 5/2009 | Wagner et al. |
| 2009/0180176 | A1 | 7/2009 | Armstrong et al. |
| 2010/0328761 | A1 * | 12/2010 | Reid ............ G02F 1/39 359/330 |
| 2011/0058248 | A1 | 3/2011 | Vodopyanov et al. |
| 2013/0017205 | A1 | 1/2013 | Giaccia et al. |
| 2013/0033704 | A1 * | 2/2013 | Zhuang ............ G01J 3/0264 356/138 |
| 2013/0114085 | A1 | 5/2013 | Wang et al. |
| 2013/0313440 | A1 | 11/2013 | Chuang et al. |
| 2014/0300890 | A1 * | 10/2014 | Lange ............ G01N 21/9501 356/51 |
| 2015/0369750 | A1 | 12/2015 | Wang et al. |
| 2016/0153914 | A1 * | 6/2016 | Lange ............ G01N 21/8806 356/237.5 |
| 2016/0334342 | A1 | 11/2016 | Chuang et al. |
| 2016/0365693 | A1 | 12/2016 | Chuang et al. |

OTHER PUBLICATIONS

Fanton et al., "Multiparameter Measurements of Thin Films Using Beam-Profile Reflectivity", Journal of Applied Physics, vol. 73, No. 11, p. 7035, 1993.

Katsumata et al., "Pipe-shaped BiCS Flash Memory with 16 Stacked Layers and Multi-Level-Cell Operation for Ultra High Density Storage Devices", 2009 Symposium on VLSI Technology Digest of Technical Papers, pp. 136-137.

Leindecker et al., "Tunable Sources: Broadband OPO Spans the Mid-IR, No Tuning Needed", Laser Focus World, Jul. 1, 2012, 4 pages.

Leng et al., "Simultaneous measurement of six layers in a silicon on insulator film stack using spectrophotometry and beam profile reflectometry", Journal of Applied Physics, vol. 81, No. 8, p. 3570, 1997.

Levenius et al., "Ultra-broadband optical parametric generation in periodically poled stoichiometric LiTaO3", Optics Express, vol. 19, No. 5, pp. 4121-4128, 2011.

Office Action mailed in Taiwan Patent Application No. 107103736 dated Sep. 2, 2021.

Office Action in Israeli Patent Application No. 267920, dated Feb. 17, 2022, 3 pages.

* cited by examiner

INSPECTION AND METROLOGY USING BROADBAND INFRARED RADIATION

CROSS-REFERENCE TO RELATED APPLICATION

The present application claims the benefit under 35 U.S.C. § 119(e) of U.S. Provisional Application Ser. No. 62/454,805, filed Feb. 5, 2017, entitled INFRARED SPECTROSCOPIC ELLIPSOMETER AND AN INFRARED REFLECTOMETER, naming Yung-Ho Alex Chuang, John Fielden, and Baigang Zhang as inventors, which is incorporated herein by reference in the entirety.

TECHNICAL FIELD

The present invention generally relates to metrology and inspection systems and methods suitable for use in semiconductor manufacturing or similar processes. More particularly, the present invention relates to broadband near-infrared and short-wavelength infrared light sources suitable for use in metrology and inspection tools.

BACKGROUND

As the density of memory devices (both NAND and DRAM) increases, semiconductor manufacturers are increasingly using thicker film stacks to pack more transistors and bits per unit area. Taller film stacks require deeper channels, vias, trenches, and similar structures to be etched into them. Thicker hardmasks and materials with stronger resistance to etching are required in order to etch the desired shapes and depths. However, hardmask materials (e.g., poly-crystalline silicon, amorphous silicon, TiN, amorphous carbon, and the like) are strongly absorbent to visible and UV wavelength light.

Current inspection and metrology techniques are inadequate for measuring or inspecting multi-micron tall structures underneath a hardmask that may be more than 100 nm thick and made with a material that is strongly absorbing to UV and visible light.

Electron microscopes may be used to inspect inside a channel, via, trench, or the like, but as the hole gets deeper, few back-scattered or secondary electrons can make it back out of a deep, narrow hole, resulting in low sensitivity to anything substantially below to the surface. Around the holes, most of the secondary electrons come from the surface of the material, and so provide little-to-no information from deep structures or defects within the material.

X-rays of appropriate wavelengths (hard X-rays if illuminating from the backside of the wafer, otherwise X-ray energies of a few keV may suffice) can penetrate through a few microns or more of common semiconductor materials. However, x-ray sources have low radiance and are weakly scattered by most semiconductor materials. Furthermore, x-ray optics are inflexible and of poor quality compared with optics for visible and IR light. Even if a high radiance x-ray source were to become available, any inspected or measured area of a semiconductor wafer would have to be exposed to a high radiation dose because the weak contrast between different materials requires a high x-ray flux to generate a strong signal. Such a high dose may easily damage semiconductor devices on the wafer by, for example, creating trapped charges in the semiconductor material.

Infrared radiation (IR) sources are known in the art. The radiance of black-body radiators, such as glow-bars, is limited by the temperature of the glow bar. Too high a temperature will melt or burn up the glow bar. Plasma light sources, such as arc lamps and laser-pumped sources, can have an emission region with a much higher temperature than a glow bar (possibly as high as approximately 10,000 to 15,000K), but it is difficult to make the plasma big enough to be optically opaque without using very high currents or large lasers. Additionally, plasma is necessarily surrounded by cooler gas that can absorb some of the emission from the hot core of the plasma and re-emit radiation at a lower black-body temperature. All of these sources emit light into $4\pi$ steradians from a relatively large emission volume (usually hundreds of microns to mm in dimensions). Such a large etendue cannot be efficiently coupled into an optical metrology or inspection instrument, and much of the emitted power is wasted.

Existing IR measurement and inspection systems have too large a measurement spot size for measuring on most patterned wafers during leading edge semiconductor manufacturing processes. These systems are also too slow for in-line use in high-volume semiconductor manufacturing. The low radiance of existing IR sources would result in any small-spot (e.g., spot or pixel dimensions smaller than about 25 μm) measurement or inspection system having a low signal level, which means that high sensitivity measurements and inspections would be very slow (potentially many minutes or longer per wafer). Slow measurements and inspections are not desirable in a high-volume semiconductor manufacturing process.

Therefore, there exists a need for a high-radiance IR source generating a broad range of wavelengths in the NIR and SWIR ranges to cure one or more of the shortcomings identified above. Metrology and inspection systems incorporating a high-radiance IR source are also needed.

SUMMARY

A system for generating broadband infrared (IR) radiation to be used in semiconductor metrology and/or inspection is disclosed, in accordance with one or more embodiments of the present disclosure. In one embodiment, the system includes an illumination source. In another embodiment, the illumination source comprises a broadband light source assembly. In another embodiment, the broadband light source assembly includes a pump source configured to generate light of a selected wavelength and a nonlinear optical (NLO) assembly configured to generate broadband IR radiation in response to the pump light generated by the pump source. In another embodiment, the system includes a detector assembly. In another embodiment, the system includes a set of optics configured to direct the IR radiation onto a sample, wherein the set of optics is further configured to direct a portion of the IR radiation from the sample to the detector assembly.

A method for generating and using broadband IR radiation in semiconductor metrology and/or inspection is disclosed, in accordance with one or more embodiments of the present disclosure. In one embodiment, the method includes generating pump light of a selected wavelength and directing the pump light to a nonlinear optical (NLO) assembly configured to generate broadband IR radiation in response to the pump light. In another embodiment, the method includes directing the IR radiation to an objective lens. In another embodiment, the method includes focusing the IR radiation onto a sample. In another embodiment, the method includes directing a portion of the IR radiation reflected or scattered from the sample to a detector assembly. In another embodiment, the method includes determining a characteristic of the sample from the portion of IR radiation detected by the detector assembly.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and, together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION OF THE INVENTION

Reference will now be made in detail to the subject matter disclosed, which is illustrated in the accompanying drawings.

The present disclosure relates to improved methods and systems for semiconductor metrology and inspection systems. The following description is presented to enable one of ordinary skill in the art to make and use embodiments of the present disclosure as provided in the context of a particular application and its requirements. As used herein, directional terms such as "top," "bottom," "over," "under," "upper," "upward," "lower," "down," "downward," and the like, are intended to provide relative positions for purposes of description, and are not intended to designate an absolute frame of reference. Various modifications to the described embodiments will be apparent to those with skill in the art, and the general principles defined herein may be applied to other embodiments. Therefore, the present disclosure is not intended to be limited to the particular embodiments shown and described, but is to be accorded the widest scope consistent with the principles and novel features herein disclosed.

Referring generally to FIGS. 1 through 6, a system and method for the generation of broadband near-infrared (NIR) and short-wavelength infrared (SWIR) illumination is described, in accordance with one or more embodiments of the present disclosure. Embodiments of the present disclosure are directed toward generating and/or using broadband IR radiation in order to inspect and/or measure defects or features deep within a stacked semiconductor structure.

Figure 1:
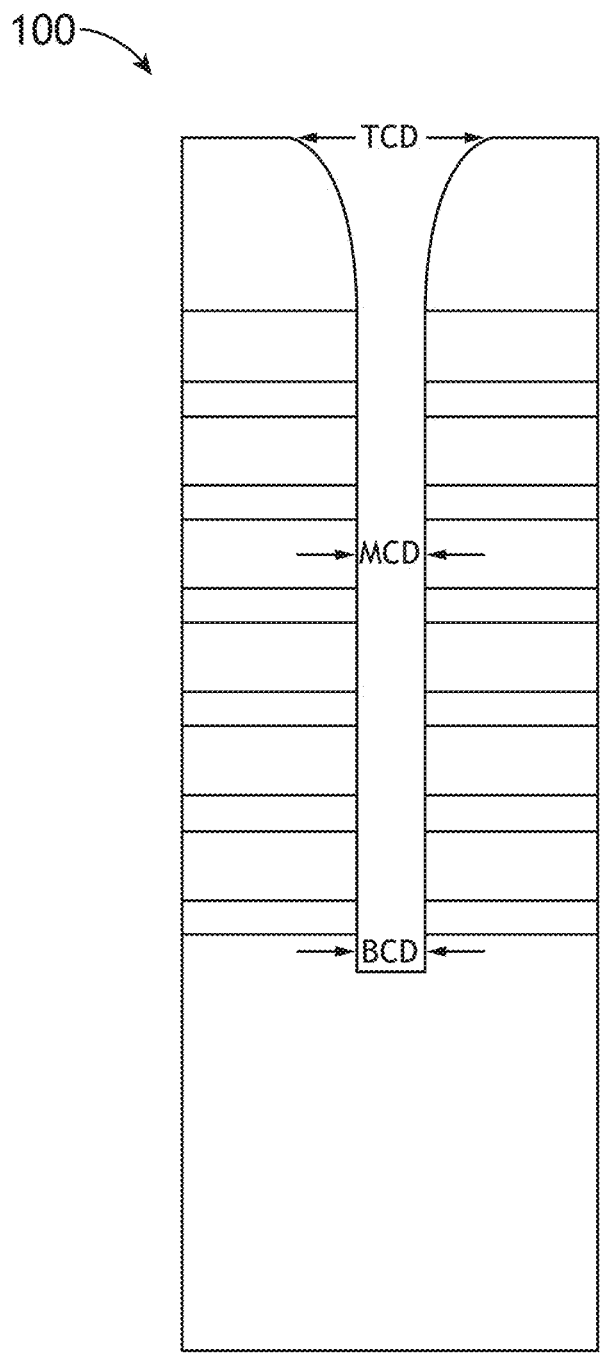
FIG. 1 illustrates a conceptual view of a unit cell of a stacked semiconductor structure, in accordance with one or more embodiments of the present disclosure.

FIG. 1 illustrates a conceptual view of a unit cell 100 of a stacked semiconductor structure, in accordance with one or more embodiments of the present disclosure. Unit cell 100 illustrates part of an exemplary structure on a semiconductor wafer that any of the systems or methods described herein may be used to measure or inspect. Unit cell 100 may be repeated many times in one or two dimensions in order to make up a larger stacked semiconductor structure. In one embodiment, unit cell 100 may include multiple layers. For example, unit cell 100 may include more than 50 pairs of layers, or more than 100 pairs of layers. While only six repeating pairs of layers are shown in FIG. 1, it is noted that FIG. 1 is provided merely for illustrative purposes, and should not be interpreted as a limitation on the scope of the present disclosure. In this regard, additional layers may be present above and below the repeating pairs of layers shown in unit cell 100. For example, a hardmask may be present on top of the repeating layers, as shown in FIG. 1.

In one embodiment, unit cell 100 may include one or more dimensions of interest at various depths throughout the unit cell 100. Dimensions of interest may include various widths, or critical dimensions. For example, unit cell 100 may include a top critical dimension (TCD), a middle critical dimension (MCD), and a bottom critical dimension (BCD). By way of another example, other structural dimensions of interest may include dimensions of interest at one of the repeating layers relative the layers above and below.

As noted previously herein, there are currently no adequate techniques for measuring or inspecting multi-micron tall structures (e.g., unit cell 100) underneath a hardmask that may be more than 100 nm thick and made with a material that is strongly absorbing to UV and visible light. For example, there are no good existing techniques which may be used to measure or inspect the BCD in FIG. 1, wherein the hardmask is strongly absorbing to UV and visible light.

Thick hardmasks may be transparent to near infrared (NIR) or short-wavelength infrared (SWIR) depending on the material and thickness of the mask. However, existing IR semiconductor metrology systems have large measurement spots (e.g., order of 1 mm) and are primarily used for measurements of unpatterned wafers. These measurement spot sizes are too large for measuring on most patterned wafers during leading edge semiconductor manufacturing processes. The instruments are also too slow for in-line use in high-volume semiconductor manufacturing. The low radiance of existing IR sources would result in any small-spot (e.g., spot or pixel dimensions smaller than about 25 µm) measurement or inspection system having a low signal level, which means that high sensitivity measurements and inspections would be very slow (potentially many minutes or longer per wafer). Slow measurements and inspections are not desirable in a high-volume semiconductor manufacturing process.

In light of the shortcomings of the current inspection and metrology systems, embodiments of the present disclosure are directed to a high-radiance IR source capable of generating a broad range of wavelengths in the NIR and SWIR ranges. It is further desirable that such sources be extendable to mid-wavelength IR, such as wavelengths as long as about 5 μm. It is noted herein that generation of a broadband IR radiation may provide for increased inspection and/or measurement capabilities in stacked semiconductor structures, as shown in FIG. 1. For example, it is noted that broadband IR radiation may be capable of penetrating hardmasks and/or stacked semiconductor structures with greater efficiency. In this regard, broadband IR radiation generated by systems and methods of the present disclosure may be capable of inspecting and/or measuring defects or features below the surface of stacked semiconductor structures (e.g., MCD, BCD, and the like).

As compared with supercontinuum sources, embodiments of the present disclosure are advantageous in that they are based on $\chi^2$ nonlinearity rather than $\chi^3$ nonlinearity. It is noted herein that $\chi^2$ nonlinearity is much more efficient than $\chi^3$ nonlinearity due to the fact that the nonlinearity coefficient is much larger. Furthermore, some supercontinuum sources generate wavelengths that are strongly absorbed by the nonlinear material (such as near UV wavelengths), which cause photo-darkening and damage of the nonlinear material. Such supercontinuum sources can be expensive to operate 24 hours per day, as the nonlinear material (such as a photonic crystal fiber or other special fiber) needs frequent replacement. Supercontinuum sources are typically very noisy with significant (multiple percent) output intensity fluctuations pulse-to-pulse. It is noted that the illumination sources of the present disclosure are quieter than supercontinuum sources.

Figure 2A:
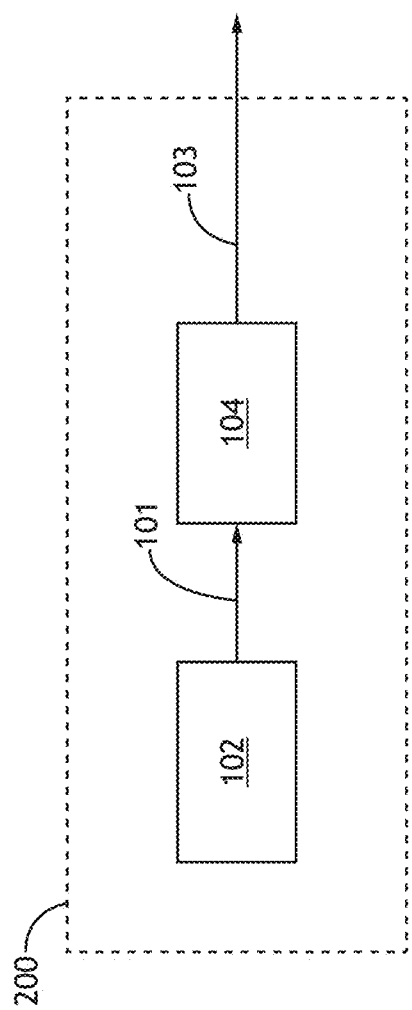
FIGS. 2A-2F illustrate simplified schematic diagrams of a system for generating broadband infrared radiation, in accordance with one or more embodiments of the present disclosure.

FIG. 2A illustrates a simplified schematic diagram of illumination source 200 for generating broadband IR radiation 103, in accordance with one or more embodiments of the present disclosure.

In one embodiment, the illumination source 200 includes a pump source 102 configured to generate pump light 101 and a nonlinear optical (NLO) assembly 104 configured to generate broadband IR radiation 103 in response to the pump light 101.

It is noted that the NLO assembly 104 may include any number and type of optical elements and components known in the art. For example, NLO assembly 104 may include, but is not limited to, one or more NLO elements. For instance, the NLO assembly 104 may include one or more NLO crystals.

Figure 2B:
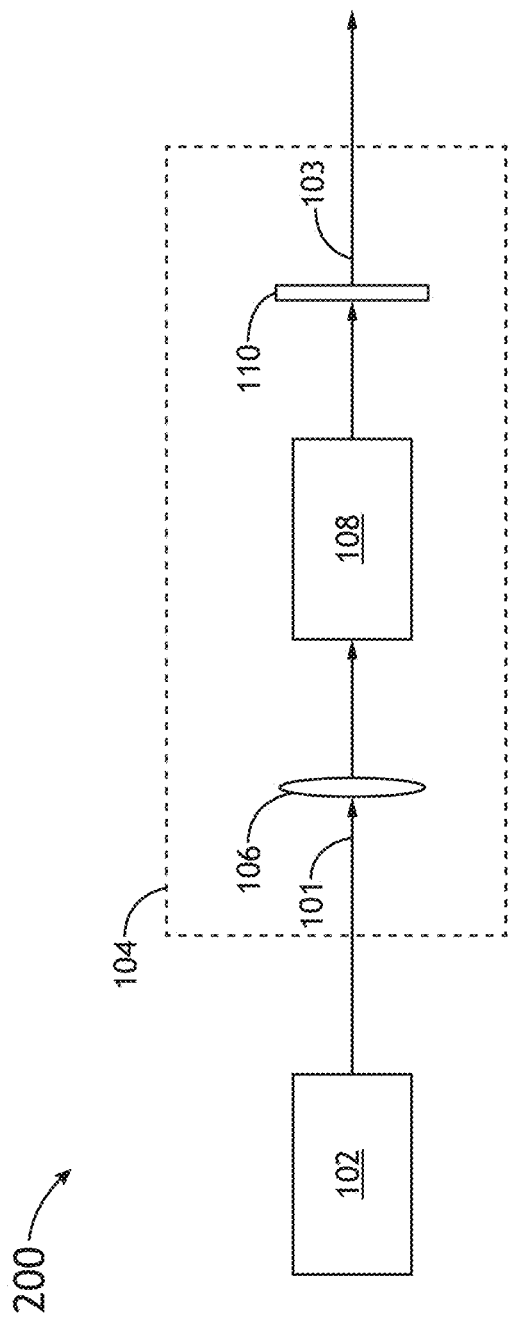

FIG. 2B illustrates a simplified schematic diagram of illumination source 200 for generating broadband IR radiation 103, in accordance with one or more embodiments of the present disclosure.

In one embodiment, as depicted in FIG. 2B, illumination source 200 includes a pump source 102 and a nonlinear optical (NLO) assembly 104. Further, the NLO assembly 104 may include, but is not limited to, one or more optical elements 106, an NLO element 108 (e.g., NLO crystal), and/or one or more filters 110. In another embodiment, the NLO element 108 of NLO assembly 104 generates broadband IR radiation 103 in response to the absorption of pump light 101.

The pump source 102 may be configured to generate pump light 101 of various wavelengths including, but not limited to, pump light 101 near 800 nm in wavelength (e.g., a Ti-sapphire laser), pump light 101 near 1 μm in wavelength (e.g., an Nd:YAG, ND-vanadate, YLF or Yb-doped fiber laser), pump light 101 near 1.5 μm in wavelength (e.g., an Er-doped fiber laser), pump light 101 near 2 μm in wavelength (e.g., a Tm-doped fiber laser), and the like. In another embodiment, pump source 102 may include a laser. In another embodiment, pump source 102 may include a pulsed laser. For example, pump source 102 may generate pulses with full-width half-maximum (FWHM) of about 5 ps or shorter.

In another embodiment, pump light 101 is modified by one or more optical elements 106. The one or more optical elements may include any optical elements known in the art including, but not limited to, one or more lenses, one or more mirrors, one or more beam splitters, one or more polarizers, and the like. In another embodiment, the one or more optical elements 106 are configured to direct the pump light 101 to the NLO element 108. For example, the pump light 101 may be focused by one or more lenses (e.g., one or more optical elements 106) to a circular or elliptical beam waist in, or proximate to, NLO element 108.

In another embodiment, NLO element 108 includes a periodically poled nonlinear optical crystal. For example, the NLO element 108 may include, but is not limited to, periodically poled lithium niobate (PPLN), periodically poled stoichiometric lithium tantalate (SLT), periodically poled magnesium-doped SLT, or orientation-patterned gallium arsenide. In another embodiment, the periodic poling or orientation patterning of the NLO element 108 may be configured such that a quasi-phase matching condition exists for wavelengths close to twice the wavelength of the pump light 101. In one embodiment, the NLO element 108 may have approximately zero group velocity dispersion for wavelengths close to twice the wavelength of the IR pump light 101. It is noted herein that this embodiment may maximize the bandwidth of the broadband IR radiation 103 generated by NLO element 108. For example, the NLO assembly may be configured to generate broadband IR radiation including a full-width half maximum (FWHM) bandwidth of at least 1.5 μm. By way of another example, the NLO assembly may be configured to generate broadband IR radiation including a FWHM bandwidth of at least 3 μm.

In another embodiment, system 200 includes one or more filters 110. One or more filters 110 may modify one or more characteristics of the broadband IR radiation 103. For example, the one or more filters 110 may filter any unconsumed pump light 101 from the broadband IR radiation 103. By way of another example, one or more filters 110 may block any undesired wavelengths or modify the shape of the spectrum of the broadband IR radiation 103.

Figure 2C:
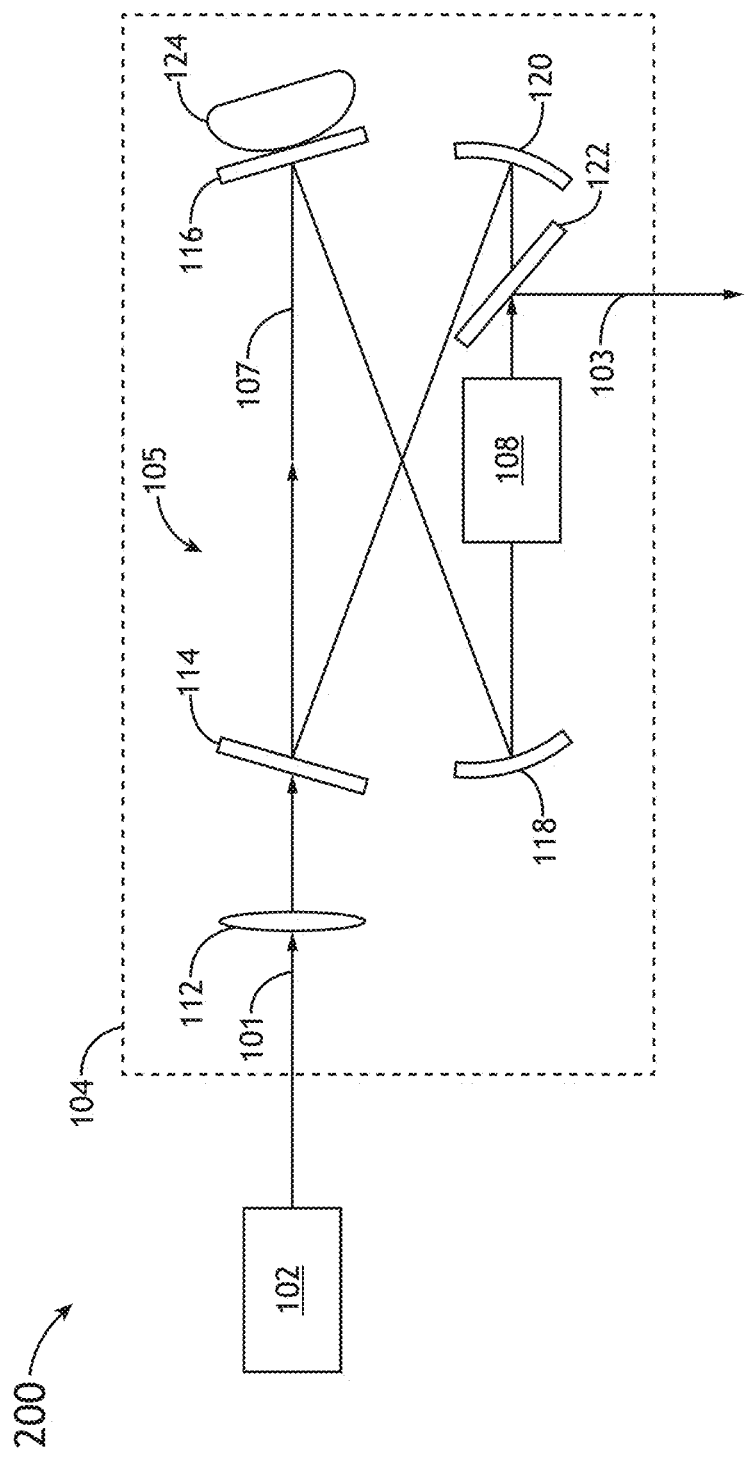

FIG. 2C illustrates a simplified schematic diagram of system 200 for generating broadband IR radiation 103, in accordance with one or more alternative and/or additional embodiments of the present disclosure. It is noted that the various embodiments and components of system 200 depicted in FIGS. 2A-2B and described in their associated description should be interpreted to extend to FIG. 2C unless otherwise noted.

In this embodiment, the NLO assembly 104 includes one or more optical elements 112, an NLO element 108, and a set of mirrors. For example, the set of mirrors may include, but are not limited to, a first mirror 114, a second mirror 116, a third mirror 118, and a fourth mirror 120. It is noted that NLO assembly 104 may be configured as an optical parametric oscillator (OPO). In this regard, the pump light 101 may be directed into an optical cavity of the OPO (e.g., optical cavity 105). In another embodiment, the NLO assembly 104 includes one or more diverting elements (e.g., dichroic mirror 122) for utilizing the generated broadband IR radiation 103.

While much of the present disclosure discusses an optical cavity 105 comprising four mirrors, this is not to be regarded as a limitation on the scope of the present disclosure. Optical cavities with varying numbers of mirrors are known in the art and may be used without departing from the spirit and scope of the present disclosure. In one embodiment, the optical cavity 105 may include one or more curved mirrors or lenses (e.g., curved third mirror 118, curved fourth mirror 120) to refocus the recirculated pump light 107 as it recirculates within the optical cavity 105.

In another embodiment, the one or more optical elements 112 (e.g., one or more lenses) may focus pump light 101 into the optical cavity 105 to match an optical cavity 105 mode such that the pump light 101 is focused to a circular or elliptical beam waist in or proximate to NLO element 108. It is noted that the previous discussion regarding NLO element 108 depicted in FIG. 2B may also be regarded as applying to NLO element 108 depicted in FIG. 2C, unless otherwise noted. In this regard, NLO element 108 depicted in FIG. 2C may be similarly configured as the NLO element 108 in FIG. 2B in order to degenerately down convert pump light 101. Furthermore, NLO element 108 may generate broadband IR radiation 103 in response to the absorption of pump light 101.

In another embodiment, pump light 101 may be recirculated within the optical cavity 105 through NLO element 108 as recirculated pump light 107 in order to increase the power density of the light at the pump wavelength (e.g., pump wavelength ω) in NLO element 108. It is noted herein that increasing the power density of the light at pump wavelength w may increase the conversion efficiency within NLO element 108. In a preferred embodiment, the optical cavity 105 may also recirculate a portion of the broadband IR radiation 103 created by NLO element 108. It is noted that recirculating a portion of the broadband IR radiation 103 created by NLO element 108 may further increase the conversion efficiency and cause the broadband IR radiation 103 to become more stable by stimulated emission of signal and idler wavelengths in NLO element 108.

It is noted herein that pump light 101 may be continuous wave (CW) or pulsed light. In embodiments with pulsed pump light 101, the optical length of the optical cavity 105 may match the separation between successive pulses. In another embodiment, a piezo-electric transducer (PZT) 124 may be configured to adjust the length of the optical cavity 105 in order to maintain locking of the recirculated pump light 107 with the input pump light 101. For example, as shown in FIG. 2C, PZT 124 may be attached to a mirror (e.g., second mirror 116) in order to adjust the length of the optical cavity 105. It is noted that any locking scheme known in the art may be used without departing from the spirit or scope of the present disclosure. It is further noted that, when the input pulses of pump light 101 are relatively long (e.g., a few ps), then real-time adjustment of the optical cavity 105 length may be unnecessary if the optical cavity 105 is designed with high mechanical and thermal stability. Conversely, it is further noted that, for CW pump light 101 and for pulsed pump light 101 with pulses shorter than a few ps, real-time locking of the optical cavity 105 may be preferred in order to maintain a high power density in NLO element 108.

In another embodiment, as shown in FIG. 2C, system 200 includes one or more diverting elements 122. One or more diverting elements 122 may include, but are not limited to, one or more pickoff mirrors, one or more beam splitters, one or more dichroic mirrors, or the like. In one embodiment, diverting elements 122 direct all or most of the broadband IR radiation 103 created in NLO element 108 out of the optical cavity 105 as broadband IR radiation 103. For example, a dichroic mirror may be used to direct about 85% of the broadband IR radiation 103 out of the optical cavity 105, leaving a small fraction of light to recirculate throughout the optical cavity 105 as recirculated pump light 107. By way of another example, a dichroic mirror may direct about 70% of the broadband IR radiation 103 out of the optical cavity 105. By way of another example, a dichroic mirror may direct about 95% of the broadband IR radiation 103 out of the optical cavity 105.

Figure 2D:
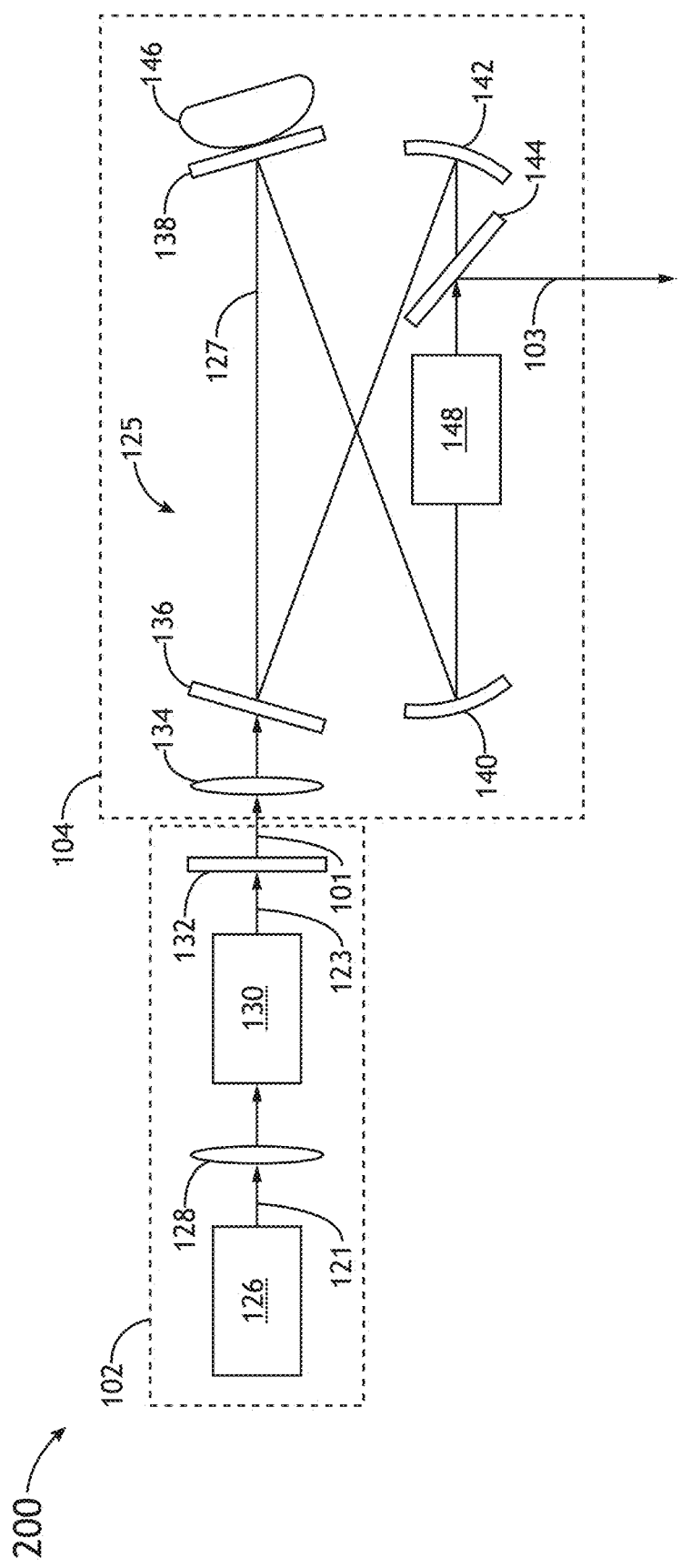

FIG. 2D illustrates a simplified schematic diagram of alternative system 200 for generating broadband IR radiation 103, in accordance with one or more alternative and/or additional embodiments of the present disclosure.

In one embodiment, as shown in FIG. 2D, system 200 may include a pump source 102 and a NLO assembly 104. In one embodiment, pump source 102 may include, but is not required to include, a laser 126 configured to generate pump light 121, one or more optical elements 128, an NLO element 130, and/or one or more filters 132. In another embodiment, NLO assembly 104 includes, but is not required to include, one or more optical elements 134, a NLO element 148, one or more diverting elements 144, and/or a set of mirrors. The set of mirrors may include, but is not limited to, a first mirror 136, a second mirror 138, a third mirror 140, and a fourth mirror 142. It is noted that NLO assembly 104 may comprise an OPO assembly. It is noted herein that the discussion regarding the various elements of systems 200 depicted in FIGS. 2A-2C and described in their associated description may also be regarded as applying to the various elements of system 200 depicted in FIG. 2D, unless noted otherwise herein.

In one embodiment, as depicted in FIG. 2D, pump source 102 comprises a laser 126 configured to generate pump light 121, one or more optical elements 128, an NLO element 130, and one or more filters 132. In one embodiment, the one or more optical elements 128 direct pump light 121 to the NLO element 130. In another embodiment, the NLO element 130 generates light 123 in response to absorption of pump light 121, wherein light 123 includes two or more different frequencies. For example, the NLO element 130 may convert the pump light 121 having a first frequency into light 123 including a second frequency and a third frequency. By way of another example, the NLO element 130 may convert the pump light 121 having a first frequency into broadband light 123.

In another embodiment, one or more filters 132 modify one or more characteristics of light 123 to produce pump light 101. For example, one or more filters 132 may block any undesired wavelengths of light 123. By way of another example, one or more filters 132 may modify the shape of the spectrum of broadband light 123.

It is noted herein that pump source 102 comprising a laser 126, one or more optical elements 128, an NLO element 130, and one or more filters 132 may allow for increased tuning of the pump light 101. It is further noted herein that an increased tuning ability of the pump light 101 entering the optical cavity 125 of NLO assembly 104 may allow for increased tuning ability of the broadband IR radiation 103.

In another embodiment, the pump source 102 directs the pump light 101 to the NLO assembly 104. In another embodiment, NLO assembly 104 includes, but is not required to include, one or more optical elements 134, a NLO element 148, one or more diverting elements 144, and/or a set of mirrors. The set of mirrors may include, but is not required to include, a first mirror 136, a second mirror 138, a third mirror 140, and a fourth mirror 142. Furthermore, the one or more diverting elements 144 may include, but are not limited to, one or more pickoff mirrors, one or more beam splitters, one or more dichroic mirrors, or the like. It is noted that the NLO assembly 104 may comprise an OPO.

Figure 2E:
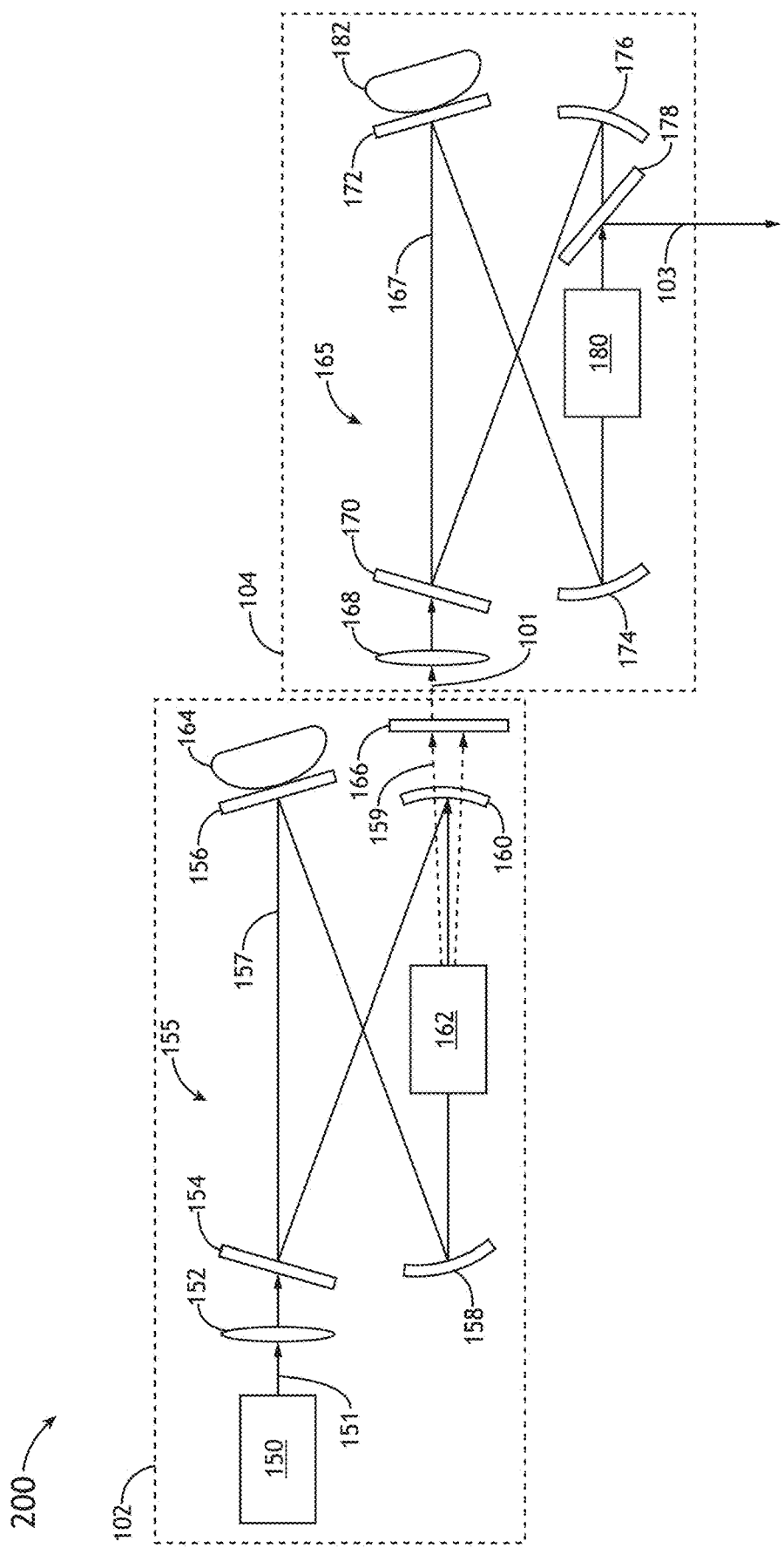

FIG. 2E illustrates a simplified schematic diagram of alternative system 200 for generating broadband IR radiation 103, in accordance with one or more alternative and/or additional embodiments of the present disclosure.

As shown in FIG. 2E, system 200 may include a pump source 102 and an NLO assembly 104. In another embodiment, pump source 102 includes, but is not required to include, a laser 150 configured to generate pump light 151, one or more optical elements 152, a NLO element 162, one or more filters 166, and/or a set of mirrors. The set of mirrors may include, but is not required to include, a first mirror 154, a second mirror 156, a third mirror 158, and a fourth mirror 160. It is noted that pump source 102 of system 200 may comprise a first OPO assembly.

In another embodiment, system 200 may include a NLO assembly 104. NLO assembly 104 may include, but is not required to include, one or more optical elements 168, a NLO element 180, one or more diverting elements 178, and/or a set of mirrors. The set of mirrors may include, but is not required to include, a first mirror 170, a second mirror 172, a third mirror 174, and a fourth mirror 176. It is noted that the NLO assembly 104 depicted in FIG. 2E may comprise a second OPO assembly.

It is further noted herein that the discussion regarding the various elements of systems 200 depicted in FIGS. 2A-2D and described in their associated description may also be regarded as applying to the various elements of system 200 depicted in FIG. 2E, unless noted otherwise herein.

As noted previously herein, pump source 102 depicted in FIG. 2E may provide for increased tuning ability of the pump light 101 directed into the optical cavity 165 of the NLO assembly 104 (e.g., the second OPO assembly), thereby increasing the tuning ability of the resulting broadband IR radiation 103.

Figure 2F:
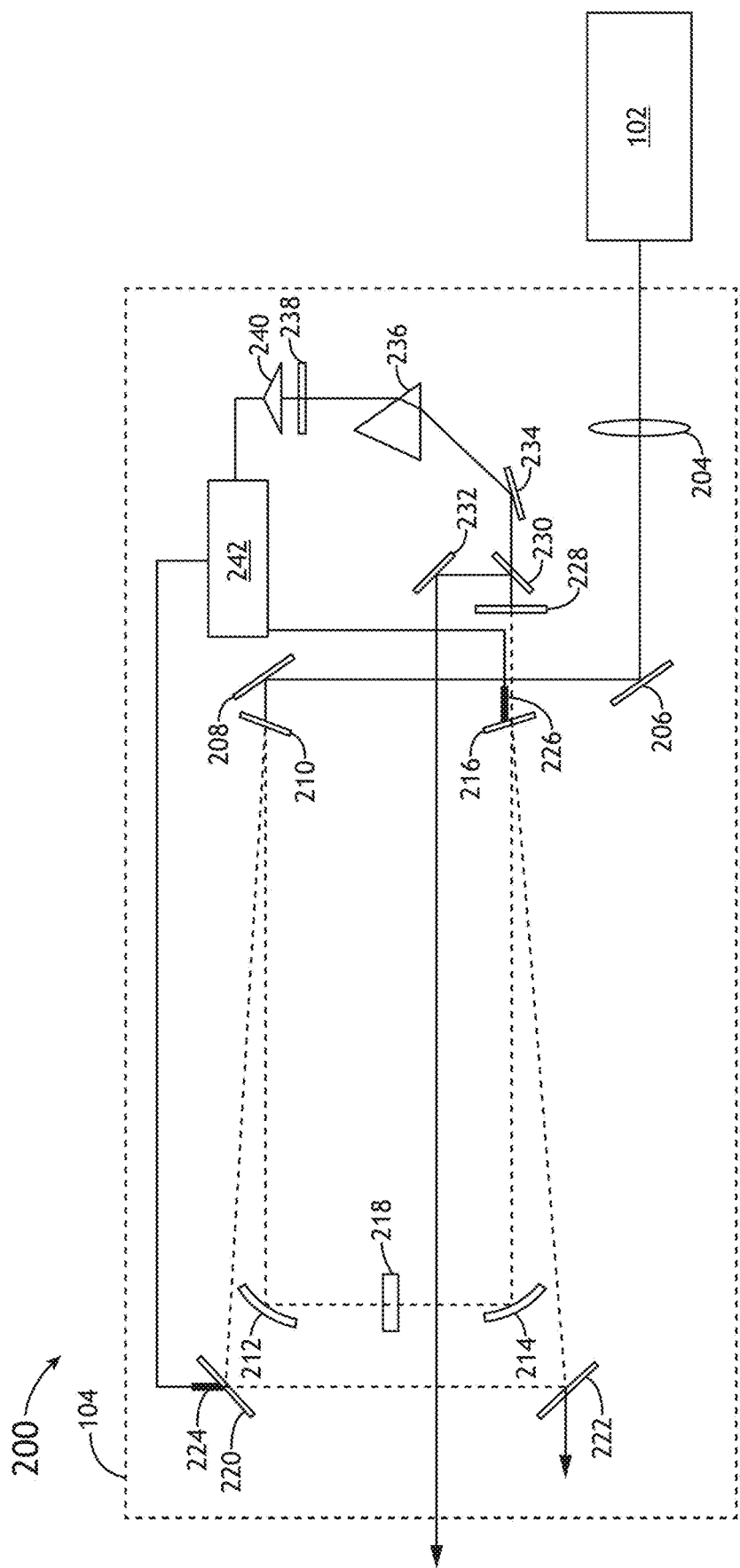

FIG. 2F illustrates a simplified schematic diagram of illumination source 200 for generating broadband IR radiation, in accordance with one or more alternative and/or additional embodiments of the present disclosure. It is noted herein that the discussion regarding the various elements of illumination source 200 depicted in FIGS. 2A-2E and described in their associated description should be interpreted to extend to the embodiment of FIG. 2F unless otherwise noted.

In one embodiment, the illumination source 200 includes a pump source 102 and a NLO assembly 104. It is noted herein that pump source 102 may include any pump source known in the art. For example, the pump source 102 may include, but is not limited to, a laser source. For instance, the pump source 102 may include a pulsed laser (e.g., 1055 nm Yb laser operating with selected pulsed energy, duration and frequency of 33 nJ, 70 fs pulse length, and 90 MHz respectively).

The NLO assembly 104 may include, but is not limited to, a mode-matching telescope 204, an input coupler 210, a NLO element 218, and a set of mirrors. For example, the set of mirrors may include, but is not required to include, a first mirror 206, a second mirror 208, a first parabolic mirror 212, and a second parabolic mirror 214. In another embodiment, the NLO assembly may include one or more components 224, 226 configured to adjust the length of the optical cavity. For example, the one or more components 224, 226 may include, but are not limited to, one or more piezo-electric transducers (PZTs). In another embodiment, NLO assembly 104 includes an output coupler 216. In another embodiment, NLO assembly 104 includes a first tuning mirror 220 and a second tuning mirror 222.

In one embodiment, pump source 102 is configured to generate pulses centered at 1055 nm (e.g., about 1 μm). In another embodiment, illumination from the pump source 102 is directed to the mode-matching telescope 204. In another embodiment, illumination is directed to the input coupler 210. In one embodiment, as shown in FIG. 2F, the input coupler 210 receives illumination from the pump source 102 (e.g., 1 μm) and generates 1 μm and 2 μm output beams. In another embodiment, the output beams of the input coupler 210 are directed through the optical cavity, wherein a portion of the output beams are directed to a NLO element 218 via the first parabolic mirror 212 and the second parabolic mirror 214. In another embodiment, the 1 μm and 2 μm output beams are combined and exit through the output coupler 216.

The Optical Society's conference publication entitled "19-nJ Five-Cycle Pulses from a 2-μm Degenerate Optical Parametric Oscillator" by Wolf et al. describes the embodiments of FIG. 2F in more detail. This publication incorporated herein by reference in its entirety.

Figure 3A:
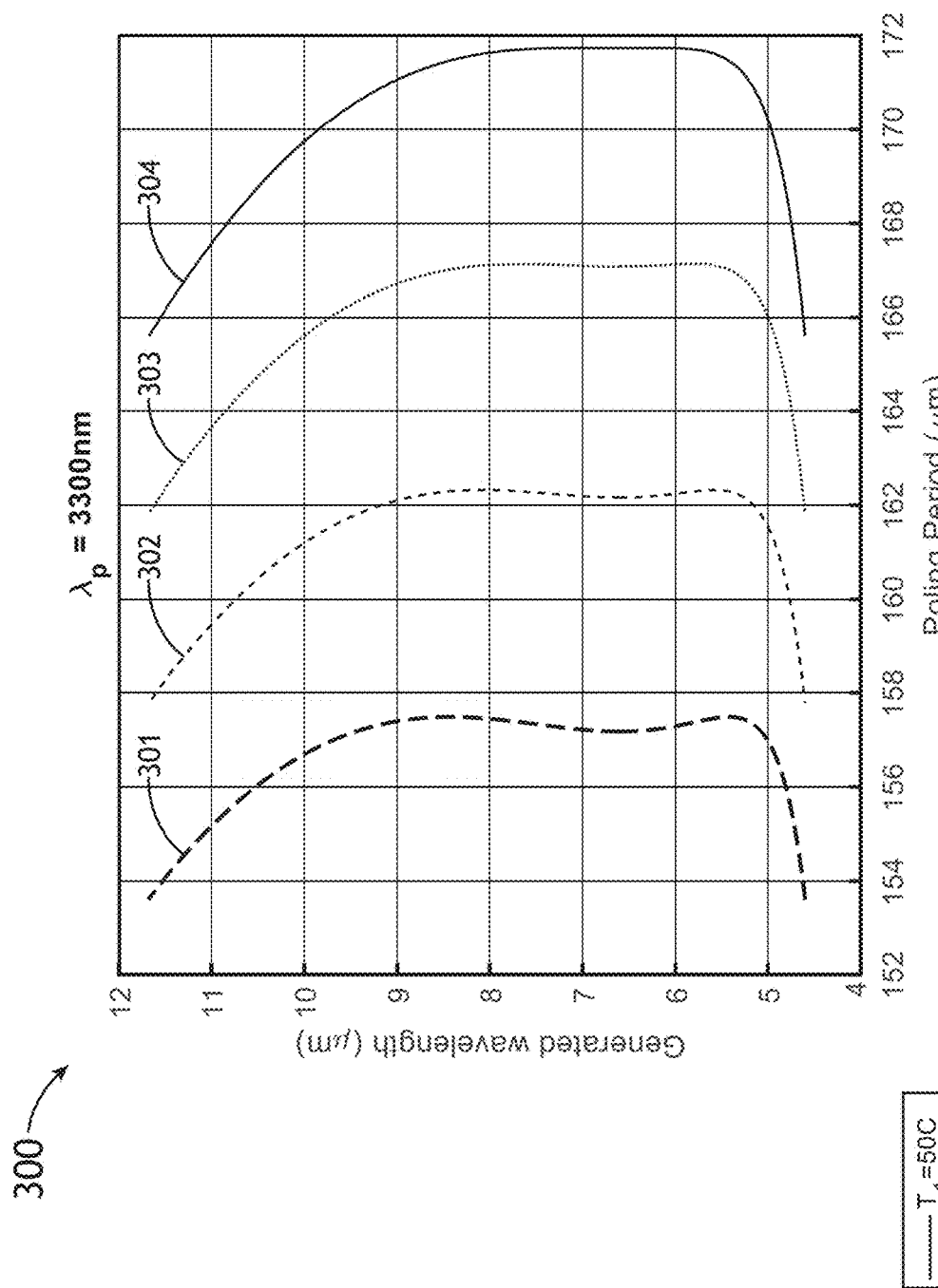
FIG. 3A illustrates a graph of generated wavelength outputs using a gallium arsenide (GaAs) optical parametric oscillator (OPO), in accordance with one or more embodiments of the present disclosure.

FIG. 3A illustrates a graph 300 of generated wavelength outputs using a GaAs optical parametric oscillator (OPO), in accordance with one or more embodiments of the present disclosure. Graph 300 displays the generated output wavelengths, in μm, of a GaAs OPO, when pumped with illumination with a pump wavelength of 3300 nm, against the polling period of the GaAs OPO, in μm.

As shown in FIG. 3A, illumination with a pump wavelength of 3300 nm was directed to a GaAs optical parametric oscillator (OPO). Curves 301, 302, 303, and 304 depict the generated wavelength outputs of the GaAs OPO, wherein curve 301 depicts the generated wavelength output of the GaAs OPO at 350° C., curve 302 depicts the generated wavelength output of the GaAs OPO at 250° C., curve 303 depicts the generated wavelength output of the GaAs OPO at 150° C., and curve 304 depicts the generated wavelength output of the GaAs OPO at 50° C. In this regard, it is noted that polling period is inversely proportional to temperature. Furthermore, due to the fact that the generated wavelengths vary according to temperature, illumination source 200 may be tuned by varying the temperature.

It is further noted that, for most polling periods, a single polling period at a particular temperature may generate two or more output wavelengths. For example, referring to curve 303, for a polling period of 166 μm, the GaAs OPO generated two wavelengths: 5.0 μm, and about 9.8 μm. Conversely, referring again to curve 303, at a polling period of about 167 μm, the GaAs OPO produced a broad spectrum of output wavelengths between about 5.5 μm to about 8.5 μm. Therefore, directing illumination with a pump wavelength of 3300 nm at a GaAs OPO at 150° C. will create broadband illumination with wavelengths ranging from about 5.5 μm to about 8.5 μm. In this regard, the curve (e.g., curves 301, 302, 303, 304) with the longest flat, vertical portion is capable of generating the broadest spectrum of output broadband illumination. For example, due to the fact that curve 303 has the longest flat, vertical portion among the curves 301, 302, 303, 304, when pumped with a pump wavelength of 3300 nm, the GaAs OPO produced the broadest spectrum of output broadband illumination at 150° C.

Figure 3B:
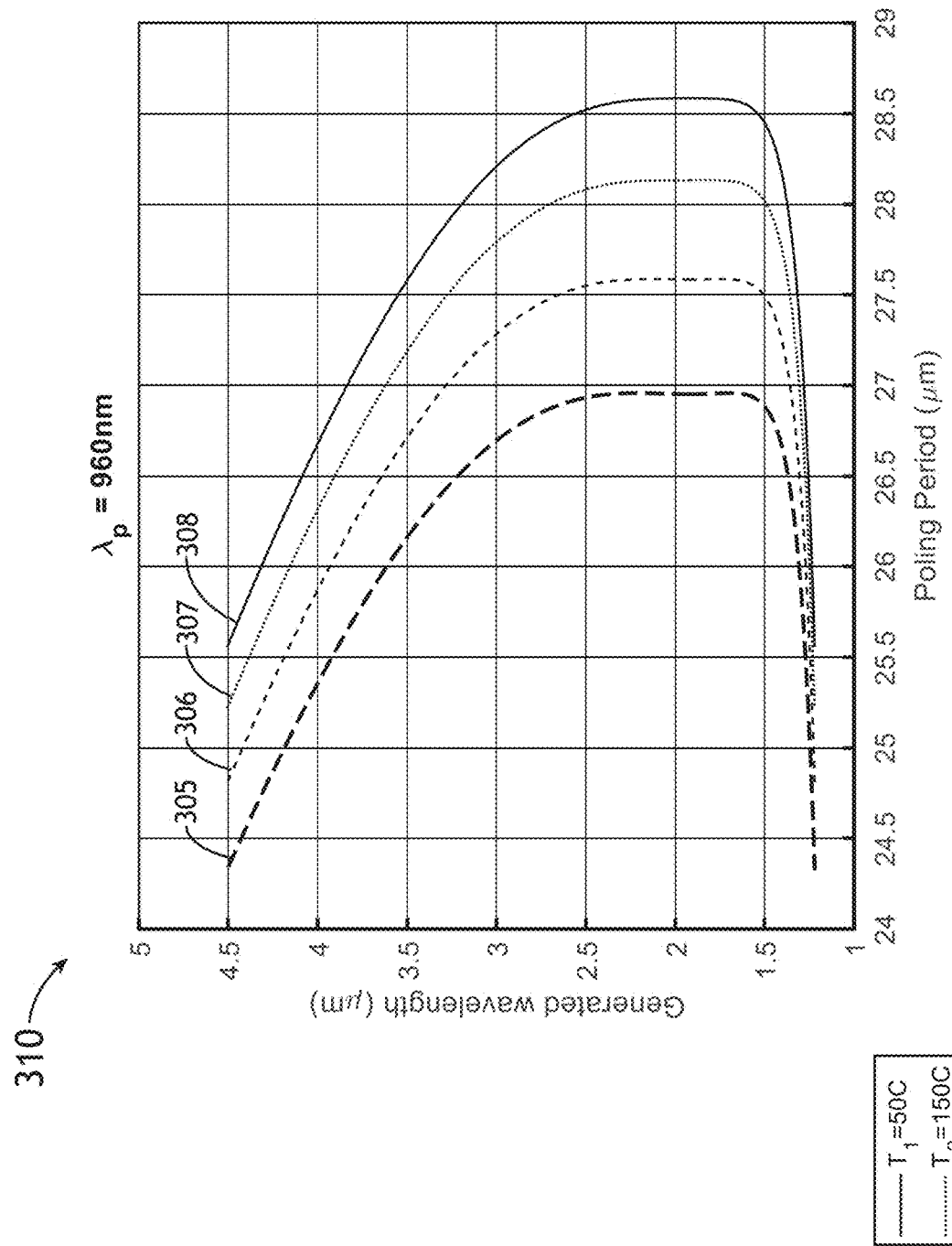
FIG. 3B illustrates a graph of generated wavelength outputs using a lithium niobate (LN) optical parametric oscillator (OPO), in accordance with one or more embodiments of the present disclosure.

FIG. 3B illustrates a graph 310 of generated wavelength outputs using a lithium niobate (LN) optical parametric oscillator (OPO), in accordance with one or more embodiments of the present disclosure. Graph 310 displays the generated output wavelengths, in µm, of a LN OPO, when pumped with a pump wavelength of 960 nm, against the polling period of the LN OPO, in µm.

As shown in FIG. 3B, illumination with a pump wavelength of 960 nm was directed to a LN optical parametric oscillator (OPO). Curves 305, 306, 307, and 308 depict the generated wavelength outputs of the LN OPO, wherein curve 305 depicts the generated wavelength output of the LN OPO at 350° C., curve 306 depicts the generated wavelength output of the LN OPO at 250° C., curve 307 depicts the generated wavelength output of the LN OPO at 150° C., and curve 308 depicts the generated wavelength output of the LN OPO at 50° C. In this regard, it is noted that polling period is inversely proportional to temperature. Furthermore, it is noted that the generation of broadband illumination may be tuned with temperature.

Similar to graph 300, the curve (e.g., curves 305, 306, 307, 308) in graph 310 with the longest flat, vertical portion is capable of generating the broadest spectrum of output broadband illumination. Referring to graph 310, curve 306 has the longest flat, vertical portion. Therefore, when pumped with a pump wavelength of 960 nm, the LN OPO produced the broadest spectrum of output broadband illumination at 250° C.

Figure 3C:
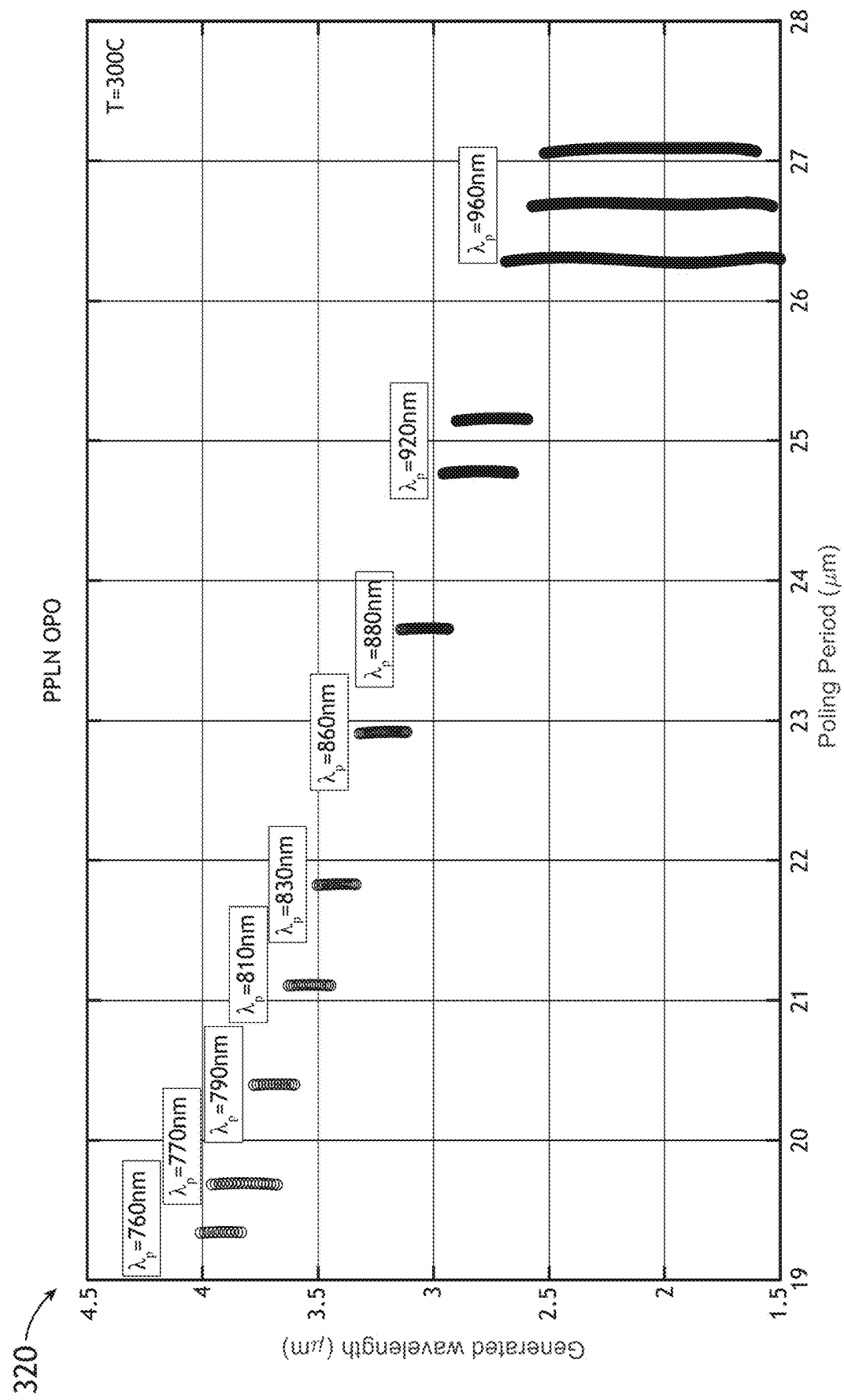
FIG. 3C illustrates a graph of generated wavelength outputs using a periodically poled lithium niobate (PPLN) optical parametric oscillator (OPO) at various pump wavelengths, in accordance with one or more embodiments of the present disclosure.

FIG. 3C illustrates a graph 320 of generated wavelength outputs at various pump wavelengths, in accordance with one or more embodiments of the present disclosure. Graph 320 displays the generated output wavelengths, in µm, of a PPLN OPO at 250° C. when pumped with various pump wavelengths, in µm.

As stated previously with reference to graphs 300, 310 in FIGS. 3A and 3B, the curves in graph 320 with flat, vertical portions indicate generated broadband output illumination. In this regard, the curve of graph 320 with the longest flat, vertical portion is capable of generating the broadest spectrum of output broadband illumination. Referring to graph 320, it is noted that using pump illumination with a pump wavelength of 960 nm produces the longest flat, vertical portion of a curve, and therefore generates the broadest spectrum of output broadband illumination.

Figure 4:
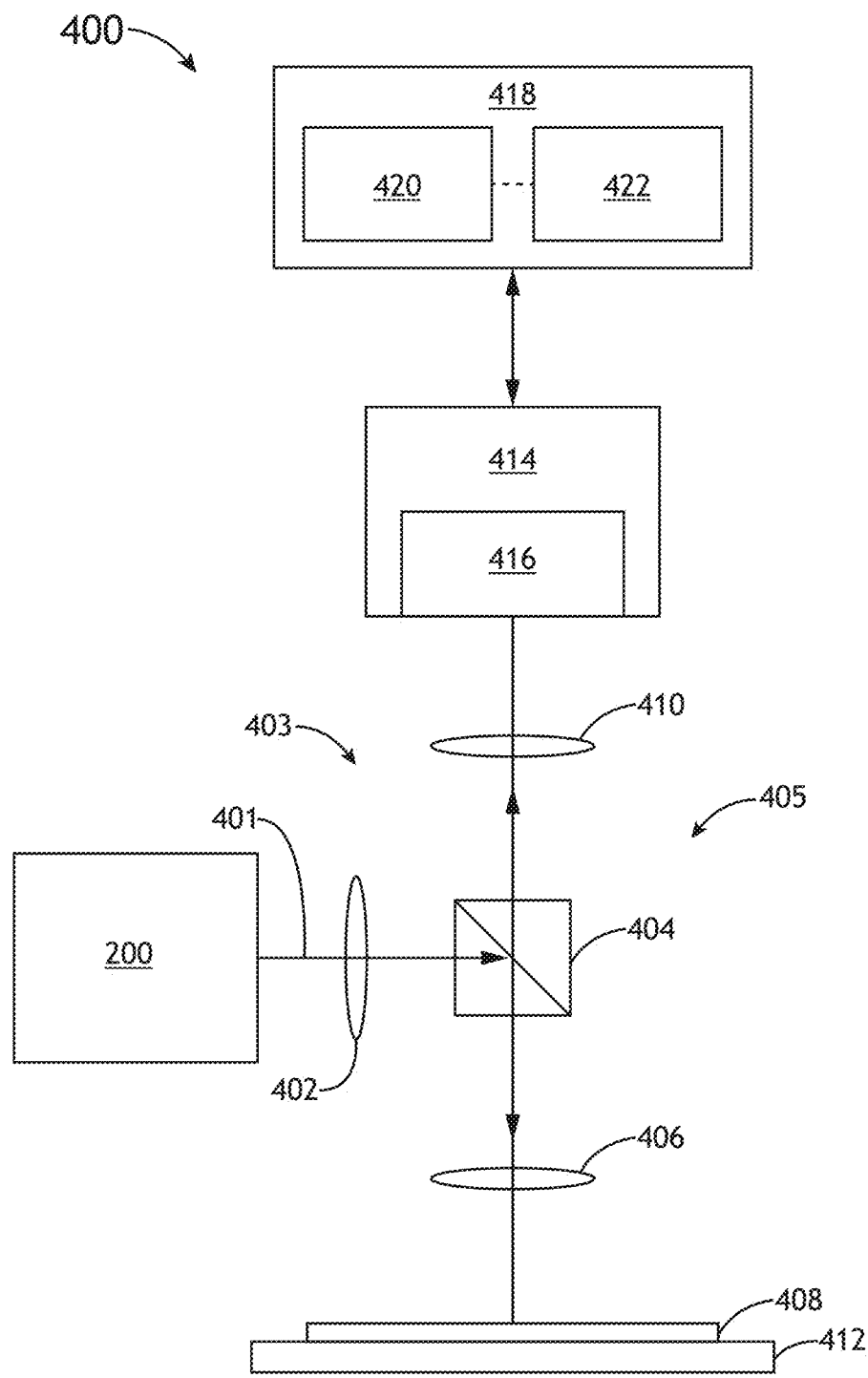
FIG. 4 illustrates a simplified schematic diagram of an inspection and/or metrology system, in accordance with one or more embodiments of the present disclosure.

FIG. 4 illustrates a simplified schematic diagram of an inspection and/or metrology system 400, in accordance with one or more embodiments of the present disclosure. It is noted that system 400 may incorporate one or more of the various embodiments of the illumination source 200 described throughout the present disclosure. In one embodiment, system 400 includes illumination source 200, an illumination arm 403, a collection arm 405, a detector 414, and a controller 418 including one or more processors 420 and memory 422.

In one embodiment, system 400 is configured to inspect and/or measure a sample 408. Sample 408 may include any sample known in the art including, but not limited to, a wafer, a reticle, a photomask, and the like. In another embodiment, sample 408 is disposed on a stage assembly 412 to facilitate the movement of sample 408. Stage 412 may include any stage assembly 412 known in the art including, but not limited to, an X-Y stage or an R-θ stage. In another embodiment, stage assembly 412 is capable of adjusting the height of sample 408 during inspection to maintain focus on the sample 408.

In one embodiment, illumination source 200 may include systems 200, as described herein. It is noted herein that illumination source 200 may include any illumination source known in the art including, but not limited to, a broadband IR radiation source pumped by a continuous-wave (CW) laser. By way of another example, illumination source 200 may include a broadband IR radiation source pumped by a pulsed laser.

In another embodiment, system 400 may include an illumination arm 403 configured to direct illumination 401 to the sample 408. It is noted that illumination source 200 of system 400 may be configured in any orientation known in the art including, but not limited to, a dark-field orientation, a light-field orientation, and the like.

The illumination arm 403 may include any number and type of optical components known in the art. In one embodiment, the illumination arm 403 includes one or more optical elements 402, a beam splitter 404, and an objective lens 406. In this regard, illumination arm 403 may be configured to focus illumination 401 from the illumination source 200 onto the surface of the sample 408. The one or more optical elements 402 may include any optical elements known in the art including, but not limited to, one or more mirrors, one or more lenses, one or more polarizers, one or more beam splitters, and the like.

In another embodiment, system 400 includes a collection arm 405 configured to collect light reflected or scattered from sample 408. In another embodiment, collection arm 405 may direct and/or focus the reflected and scattered light to a sensor 416 of a detector assembly 414. It is noted that sensor 416 and detector assembly 414 may include any sensor and detector assembly known in the art. For example, sensor 416 may include a line sensor or an electron-bombarded line sensor.

In another embodiment, detector assembly 414 is communicatively coupled to a controller 418 including one or more processors 420 and memory 422. In another embodiment, one or more processors 420 may be communicatively coupled to memory 422, wherein the one or more processors 420 are configured to execute a set of program instructions stored on memory 422. In one embodiment, the one or more processors 420 may be configured to analyze the output of detector assembly 414. In one embodiment, the set of program instructions are configured to cause the one or more processors 420 to analyze one or more characteristics of sample 408. In another embodiment, the set of program instructions are configured to cause the one or more processors 420 to modify one or more characteristics of system 400 in order to maintain focus on the sample 408 and/or the sensor 416. For example, the one or more processors 420 may be configured to adjust the objective lens 406 or one or more optical elements 402 in order to focus illumination 401 from illumination source 200 onto the surface of the sample 408. By way of another example, the one or more processors 420 may be configured to adjust the objective lens 406 and/or one or more optical elements 410 in order to collect illumination scattered and/or reflected off the surface of the sample 408 and focus the collected illumination on the sensor 416.

In another embodiment, system 400 may include a user interface (not shown). In another embodiment, user interface may include a display.

In one embodiment, system 400 may be configured to provide depth resolution for the inspection or measurement within a tall structure. For example, system 400 may include a confocal aperture in collection arm 405 or detector assembly 414. In this embodiment, the confocal aperture may be communicatively coupled to one or more processors 420 such that the one or more processors 420 may adjust one or more characteristics of the confocal aperture. U.S. patent application Ser. No. 15/153,543 entitled "Sensor With Electrically Controllable Aperture For Inspection And Metrology", filed by Chuang et al. on May 12, 2016, and Ser. No. 14/691,966 P4440 (Published Application No. 2015/0369750), entitled "CONFOCAL LINE INSPECTION OPTICAL SYSTEM", and filed by Wang et al. on Apr. 21, 2015 describe more details of confocal inspection and metrology systems. These applications are incorporated herein by reference.

Additional details of various embodiments of inspection or metrology system 400 are described in U.S. patent application Ser. No. 13/554,954, entitled "Wafer inspection system", filed on Jul. 9, 2012, U.S. Published Patent Application 2009/0180176, entitled "Split field inspection system using small catadioptric objectives", published on Jul. 16, 2009, U.S. Published Patent Application 2007/0002465, entitled "Beam delivery system for laser dark-field illumination in a catadioptric optical system", published on Jan. 4, 2007, U.S. Pat. No. 5,999,310, entitled "Ultra-broadband UV microscope imaging system with wide range zoom capability, issued on Dec. 7, 1999, U.S. Pat. No. 7,525,649, entitled "Surface inspection system using laser line illumination with two dimensional imaging", issued on Apr. 28, 2009, U.S. Provisional Patent Application 62/111,421, filed on Feb. 3, 2015, by Zhuang et al., U.S. Published Patent Application 2013/0114085, entitled "Dynamically Adjustable Semiconductor Metrology System", by Wang et al. and published on May 9, 2013, U.S. Pat. No. 5,608,526, entitled "Focused Beam Spectroscopic Ellipsometry Method and System", by Piwonka-Corle et al., issued on Mar. 4, 1997, and U.S. Pat. No. 6,297,880, entitled "Apparatus for Analysing Multi-Layer Thin Film Stacks on Semiconductors", by Rosencwaig et al., issued on Oct. 2, 2001. All of these patents and patent applications are incorporated herein by reference.

Figure 5:
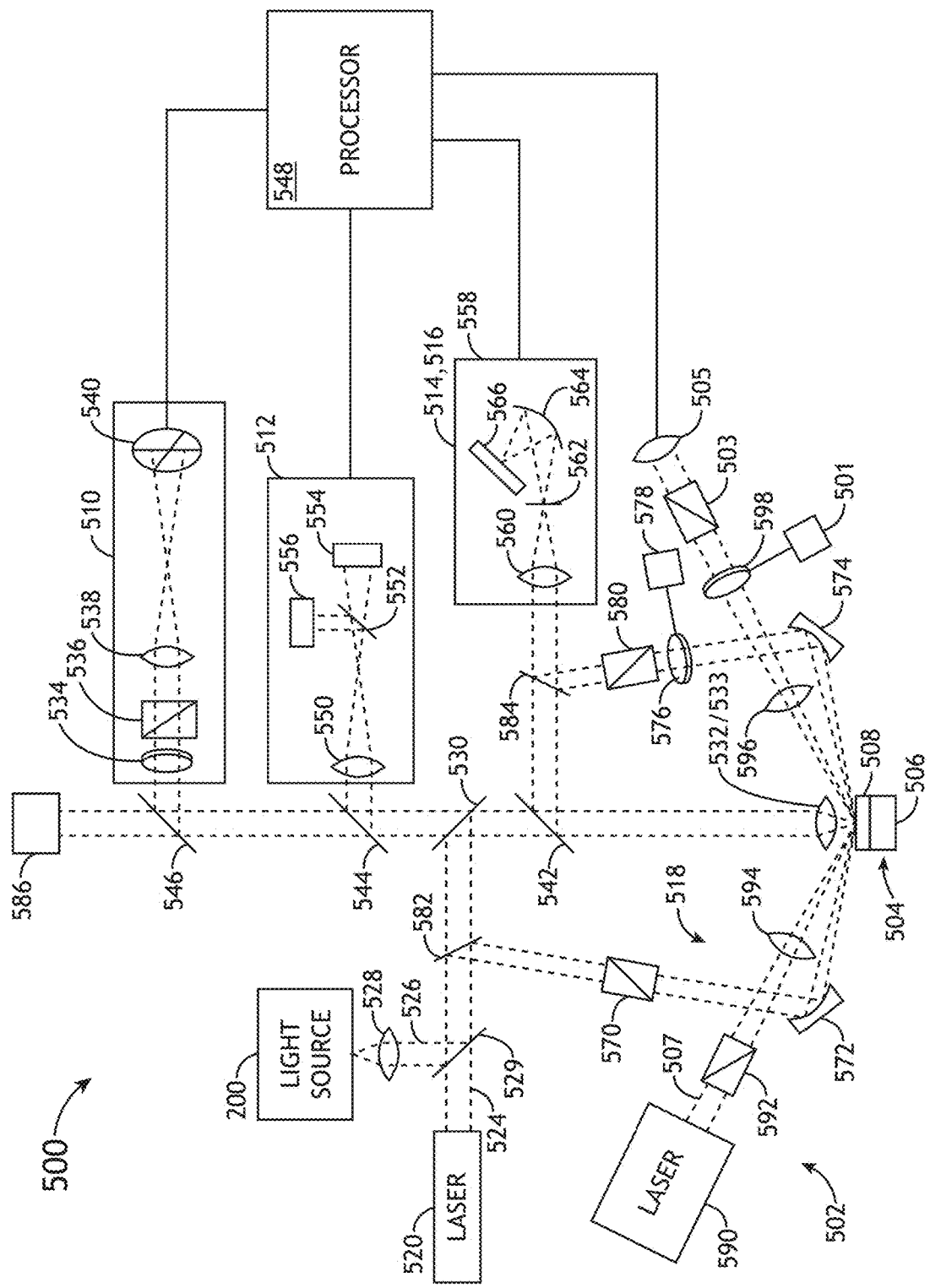
FIG. 5 illustrates a simplified schematic diagram of an inspection and/or metrology system, in accordance with one or more embodiments of the present disclosure.

FIG. 5 illustrates a simplified schematic diagram of an inspection and/or metrology system 500, in accordance with one or more embodiments of the present disclosure. In one embodiment, system 500 may include multiple measurement and/or inspection subsystems which are configured to implement one or more of the systems 200 or methods described herein.

In one embodiment, system 500 may include a Beam Profile Ellipsometer (BPE) 510, a Beam Profile Reflectometer (BPR) 512, a Broadband Reflective Spectrometer (BRS) 514, a Broadband Spectroscopic Ellipsometer (BSE) 518, and a reference ellipsometer 502. In one embodiment, these six optical measurement devices may utilize as few as three optical sources including, but not limited to, lasers 520, 590, and illumination source 200, as described previously herein.

In another embodiment, illumination source 200 may include a broadband, laser-pumped plasma lamp and a broadband IR source so that the combination produces a polychromatic beam that covers a spectrum of about 200 nm to about 2.5 µm or broader. In one embodiment, broadband light source includes a broadband IR light source and produces a polychromatic beam that covers a spectrum of about 1 µm to about 3 µm or longer. The probe beams 524, 526 are reflected by mirror 530, and pass through mirror 542 to a sample 504.

In another embodiment, laser 520 may generate a probe beam 524, and illumination source 102 may generate probe beam 526 (which is collimated by lens 528 and directed along the same path as probe beam 524 by mirror 529). In a preferred embodiment, laser 520 may be a solid state laser diode which emits a linearly polarized 3 mW beam at a visible or near IR wavelength such as a wavelength near 670 nm.

In one embodiment, probe beams 524, 526 are focused onto the surface of the sample 504 via one or more lenses 532, 533. In the preferred embodiment, lenses 532, 533 are mounted in a turret (not shown) and are alternately movable into the path of probe beams 524, 526. Lenses 532, 533 may include any lens known in the art. For example, lens 532 may be a microscope objective lens with a high numerical aperture (on the order of 0.90 NA) to create a large spread of angles of incidence with respect to the sample surface, and to create a spot size of about one micron in diameter. By way of another example, lens 533 may be a reflective lens having a lower numerical aperture (on the order of 0.1 to 0.4 NA) and capable of focusing broadband light to a spot size of about 5-20 µm. It is noted herein that the use of the term 'lens' in the present disclosure may include curved mirrors and optics that comprise a combination of mirrors and lenses. It is further noted that, because some embodiments of the present disclosure incorporate light sources emitting wavelengths over a spectrum from the UV to the IR, curved mirrors can be conveniently used for focusing the light with minimal chromatic aberration.

Beam profile ellipsometry (BPE) is discussed in U.S. Pat. No. 5,181,080, issued Jan. 19, 1993, which is incorporated herein by reference. In one embodiment, BPE 510 may include a quarter-wave plate 534, polarizer 536, lens 538 and a quad sensor 540. In another embodiment, linearly polarized probe beam 524 may be focused onto sample 504 by lens 532. In another embodiment, light reflected from the surface of sample 504 may pass up through lens 532, mirrors 542, 530, 544, and be directed into BPE 510 by mirror 546. The positions of the rays within the reflected probe beam correspond to specific angles of incidence with respect to the surface of the sample 504. In one embodiment, quarter-wave plate 534 may retard the phase of one of the polarization states of the beam by 90 degrees. In another embodiment, linear polarizer 536 may cause the two polarization states of the beam to interfere with each other. For maximum signal, the axis of the polarizer 536 may be oriented at an angle of 45 degrees with respect to the fast and slow axis of the quarter-wave plate 534. In another embodiment, sensor 540 may be a quad-cell sensor with four radially disposed quadrants. In this regard, each of the four radially disposed quadrants may each intercept one quarter of the probe beam and generate a separate output signal proportional to the power of the portion of the probe beam striking that quadrant. In one embodiment, output signals from each quadrant are sent to one or more processors 548. As discussed in U.S. Pat. No. 5,181,080, by monitoring the change in the polarization state of the beam, ellipsometric information, such as LP and A, can be determined.

In one embodiment, system 500 may include a beam profile reflectometry (BPR) 512. Beam profile reflectometry (BPR) is discussed in U.S. Pat. No. 4,999,014, issued on Mar. 12, 1991, which is incorporated herein by reference. In one embodiment, BPR 512 may include a lens 550, beam splitter 552 and two linear sensor arrays 554 and 556 to measure the reflectance of the sample 504. In one embodiment, linearly polarized probe beam 524 may be focused onto sample 504 by lens 532, with various rays within the beam striking the surface of the sample 504 at a range of angles of incidence. In another embodiment, light reflected from the sample 504 surface may pass up through lens 532, mirrors 542 and 530, and be directed into BPR 512 by mirror 544. The positions of the rays within the reflected probe beam correspond to specific angles of incidence with respect to the surface of the sample 504. In one embodiment, lens 550 spatially spreads the beam two-dimensionally. In another embodiment, beam splitter 552 may separate the s and p components of the beam. In another embodiment, sensor arrays 554 and 556 may be oriented orthogonal to each other to isolate information about s and p polarized light. It is noted that the higher angles of incidence rays will fall closer to the opposed ends of the arrays. It is further noted that the output from each element in the sensor arrays 554, 556 will correspond to different angles of incidence.

In another embodiment, sensor arrays 554, 556 may measure the intensity across the reflected probe beam as a function of the angle of incidence with respect to the sample 504 surface. It is noted herein that sensor arrays 554, 556 may comprise one or more line sensors. In another embodiment, one or more processors 548 may receive the output of the sensor arrays 554, 556, and derive the thickness and refractive index of the thin film layer 508 based on these angular dependent intensity measurements by utilizing various types of modeling algorithms. Optimization routines which use iterative processes such as least square fitting routines are typically employed. One example of this type of optimization routine is described in "Multiparameter Measurements of Thin Films Using Beam-Profile Reflectivity," Fanton et al., Journal of Applied Physics, Vol. 73, No. 11, p. 7035, 1993. Another example appears in "Simultaneous Measurement of Six Layers in a Silicon on Insulator Film Stack Using Spectrophotometry and Beam Profile Reflectometry," Leng et al., Journal of Applied Physics, Vol. 81, No. 8, page 3570, 1997. Both of these publications are incorporated herein by reference.

In another embodiment, system 500 may include a broadband reflective spectrometer (BRS) 514. In one embodiment, BRS 514 may simultaneously probe the sample 504 with multiple wavelengths of light. In another embodiment, BRS 514 may use lenses 532, 533 to direct light to the surface of the sample 504. In another embodiment, BRS 514 may include a broadband spectrometer 558. It is noted that broadband spectrometer 558 may include any broadband spectrometer known in the art. In one embodiment, broadband spectrometer 558 may include a lens 560, aperture 562, dispersive element 564, and sensor array 566. In one embodiment, probe beam 526 from illumination source 200 may be focused onto sample 504 by lens 532. Light reflected from the surface of the sample 504 may pass up through lens 532, and be directed by mirror 542 (through mirror 584) to broadband spectrometer 558. In one embodiment, lens 560 may focus the probe beam through aperture 562, which defines a spot in the field of view on the sample 504 surface to analyze.

In one embodiment, dispersive element 564 (e.g., diffraction grating, prism, holographic plate, and the like) angularly disperses the beam as a function of wavelength to individual sensor elements contained in the sensor array 566. The different sensor elements may measure the optical intensities of the different wavelengths of light contained in the probe beam. In a preferred embodiment, sensor array 566 comprises a line sensor. In another embodiment, dispersive element 564 may also be configured to disperse the light as a function of wavelength in one direction, and as a function of the angle of incidence with respect to the sample 504 surface in an orthogonal direction, such that simultaneous measurements as a function of both wavelength and angle of incidence are possible. In such an embodiment, sensor array 566 may comprise a line sensor configured so as to simultaneously collect 2 or 3 spectra, each spectrum corresponding to a different range of angles of incidence. In another embodiment, one or more processors 548 may process the intensity information measured by the sensor array 566. It is noted that, when only a subset of the wavelengths is needed for a specific measurement (e.g., if only visible wavelengths are needed), a refractive lens may be used for the measurements. It is further noted that, when IR and/or UV are needed for a specific measurement, reflective lens 533 may be used instead of focusing lens 532. In one embodiment, a turret (not shown) containing lenses 532, 533 may be rotated such that reflective lens 533 is aligned in probe beam 526. It is noted herein that reflective lens 533 may be necessary because refractive lenses may be unable focus a wide range of wavelengths onto the sample without substantial chromatic aberration.

In one embodiment, system 500 may include broadband spectroscopic ellipsometry (BSE) 518. Broadband spectroscopic ellipsometry (BSE) is discussed in U.S. Pat. No. 5,877,859, issued on Mar. 2, 1999 to Aspnes et al., which is incorporated by reference herein. In one embodiment, BSE 518 may include a polarizer 570, focusing mirror 572, collimating mirror 574, rotating compensator 576, and analyzer 580. In one embodiment, mirror 582 may direct at least part of probe beam 526 to polarizer 570, which creates a known polarization state for the probe beam 526. In a preferred embodiment, the polarization state for the probe beam 526 is a linear polarization. In another embodiment, mirror 572 focuses the beam onto the sample 504 surface at an oblique angle, ideally on the order of 70 degrees to the normal of the sample 504 surface. Based upon well-known ellipsometric principles, the reflected beam will generally have a mixed linear and circular polarization state after interacting with the sample 504, based upon the composition and thickness of the sample's 504 film 508 and substrate 506. In another embodiment, reflected beam is collimated by mirror 574, which directs the beam to the rotating compensator 576.

In another embodiment, compensator 576 introduces a relative phase delay δ(phase retardation) between a pair of mutually orthogonal polarized optical beam components. In another embodiment, compensator 576 is rotated at an angular velocity ω about an axis substantially parallel to the propagation direction of the beam, preferably by an electric motor 578. In another embodiment, analyzer 580 mixes the polarization states incident on it. In a preferred embodiment, analyzer 580 is another linear polarizer. By measuring the light transmitted by analyzer 580, the polarization state of the reflected probe beam 526 may be determined. In another embodiment, mirror 584 directs the beam to spectrometer 558, which simultaneously measures on sensor 566 the intensities of the different wavelengths of light in the reflected probe beam that pass through the compensator/analyzer combination. In a preferred embodiment, sensor 566 comprises a line sensor. In another embodiment, in order to solve for sample characteristics, such as the ellipsometric values Ψ and Δ (as described in U.S. Pat. No. 5,877,859) one or more processors 548 receive the output of the sensor 566, and processes the intensity information measured by the sensor 566 as a function of wavelength and the azimuth (rotational) angle of the compensator 576 about its axis of rotation.

In one embodiment, detector 586 may be positioned above mirror 546, and can be used to view reflected beams off of the sample 504 for alignment and focus purposes. It is noted herein that detector 586 may include any detector assembly known in the art.

In one embodiment, in order to calibrate BPE 510, BPR 512, BRS 514, and BSE 518, system 500 may include the wavelength stable calibration reference ellipsometer 502 that may be used in conjunction with a reference sample 504. In one embodiment, ellipsometer 502 may include a light source 590, polarizer 592, lenses 594, 596, rotating compensator 598, analyzer 503, and detector 505.

In one embodiment, light source 590 produces a quasi-monochromatic probe beam 507 having a known stable wavelength and stable intensity. The wavelength of beam 507, which is a known constant or a measured value, is provided to one or more processors 548 such that ellipsometer 502 can accurately calibrate the optical measurement devices in system 500.

In another embodiment, beam 507 interacts with polarizer 592 to create a known polarization state. In a preferred embodiment, polarizer 592 is a linear polarizer made from a quartz Rochon prism. However, it is noted that, in general, the polarization does not necessarily have to be linear, nor even complete. Polarizer 592 may also be made from calcite or $MgF_2$. In one embodiment, the azimuth angle of polarizer 592 is oriented such that the plane of the electric vector associated with the linearly polarized beam exiting from the polarizer 592 is at a known angle with respect to the plane of incidence (defined by the propagation direction of the beam 507 and the normal to the surface of sample 504). The azimuth angle is preferably selected to be on the order of 30 degrees because the sensitivity is optimized when the reflected intensities of the P and S polarized components are approximately balanced. It is noted herein that polarizer 592 may be omitted if the light source 590 emits light with the desired known polarization state.

In one embodiment, beam 507 is focused onto the sample 504 by lens 594 at an oblique angle. In a preferred embodiment, beam 507 is incident on sample 504 at an angle on the order of 70 degrees to the normal of the sample 504 surface. It is noted herein that sensitivity to sample 504 properties is maximized in the vicinity of the Brewster or pseudo-Brewster angle of a material. Based upon well-known ellipsometric principles, the reflected beam will generally have a mixed linear and circular polarization state after interacting with the sample 504, as compared to the linear polarization state of the incoming beam 507.

In another embodiment, lens 596 collimates beam 507 after its reflection off the sample 504. In another embodiment, beam 507 then passes through the rotating compensator (retarder) 598, which introduces a relative phase delay Or (phase retardation) between a pair of mutually orthogonal polarized optical beam components. The amount of phase retardation is a function of the wavelength, the dispersion characteristics of the material used to form the compensator, and the thickness of the compensator. In one embodiment, compensator 598 is rotated at an angular velocity ωr about an axis substantially parallel to the propagation direction of beam 507, preferably by an electric motor 501. It is noted that compensator 598 may include any conventional wave-plate compensator known in the art. For example, the compensator may include a wave-plate compensator made of crystal quartz. The thickness and material of the compensator may be selected such that a desired phase retardation of the beam is induced. Typically, a phase retardation of about 90° is convenient.

In another embodiment, beam 507 interacts with analyzer 503, which serves to mix the polarization states incident on it. In this embodiment, analyzer 503 is another linear polarizer, preferably oriented at an azimuth angle of 45 degrees relative to the plane of incidence. However, it is noted that any optical device that serves to appropriately mix the incoming polarization states can be used as an analyzer 503. In a preferred embodiment, analyzer 503 is a quartz Rochon or Wollaston prism.

It is noted herein that compensator 598 may be located either between the sample 504 and the analyzer 503 (as shown in FIG. 5). Alternatively, compensator 598 may be located between the sample 504 and the polarizer 592. It is further noted that polarizer 592, lenses 594, 596, compensator 598, and analyzer 503 may all be optimized in their construction for the specific wavelength of light produced by light source 590, which maximizes the accuracy of ellipsometer 502.

In another embodiment, beam 507 may enter detector 505, which measures the intensity of the beam passing through the compensator/analyzer combination. In another embodiment, one or more processor 548 processes the intensity information measured by the detector 505 to determine the polarization state of the light after interacting with the analyzer 503, and therefore the ellipsometric parameters of the sample 504. This information processing may include measuring beam intensity as a function of the azimuth (rotational) angle of the compensator about its axis of rotation. This measurement of intensity as a function of compensator rotational angle is effectively a measurement of the intensity of beam 507 as a function of time, since the compensator angular velocity is usually known and constant.

U.S. Pat. No. 6,297,880, which issued on Oct. 2, 2001 to Rosencwaig et al. and is incorporated by reference herein, describes metrology system 500 in further detail. U.S. Pat. No. 6,429,943, which issued on Aug. 6, 2002 to Opsal et al. and is incorporated by reference herein, describes how metrology system 500 may be used for scatterometry measurements. U.S. Pat. No. 5,608,526, which issued on Mar. 4, 1997 to Piwonka-Corle et al. and is incorporated by reference herein, describes an alternative embodiment of metrology system 500 that incorporates a spectroscopic ellipsometer and a spectrophotometer. Either, or both, of the spectroscopic ellipsometer and spectrophotometer may incorporate the broadband IR light source described herein and may be used in methods of measuring a sample described herein.

The embodiments of the systems 200, 400, 500 illustrated in FIGS. 2A-2E, FIG. 4, and FIG. 5 may be further configured as described herein. In addition, the systems 200, 400, 500 may be configured to perform any other step(s) of any of the method embodiment(s) described herein.

Figure 6:
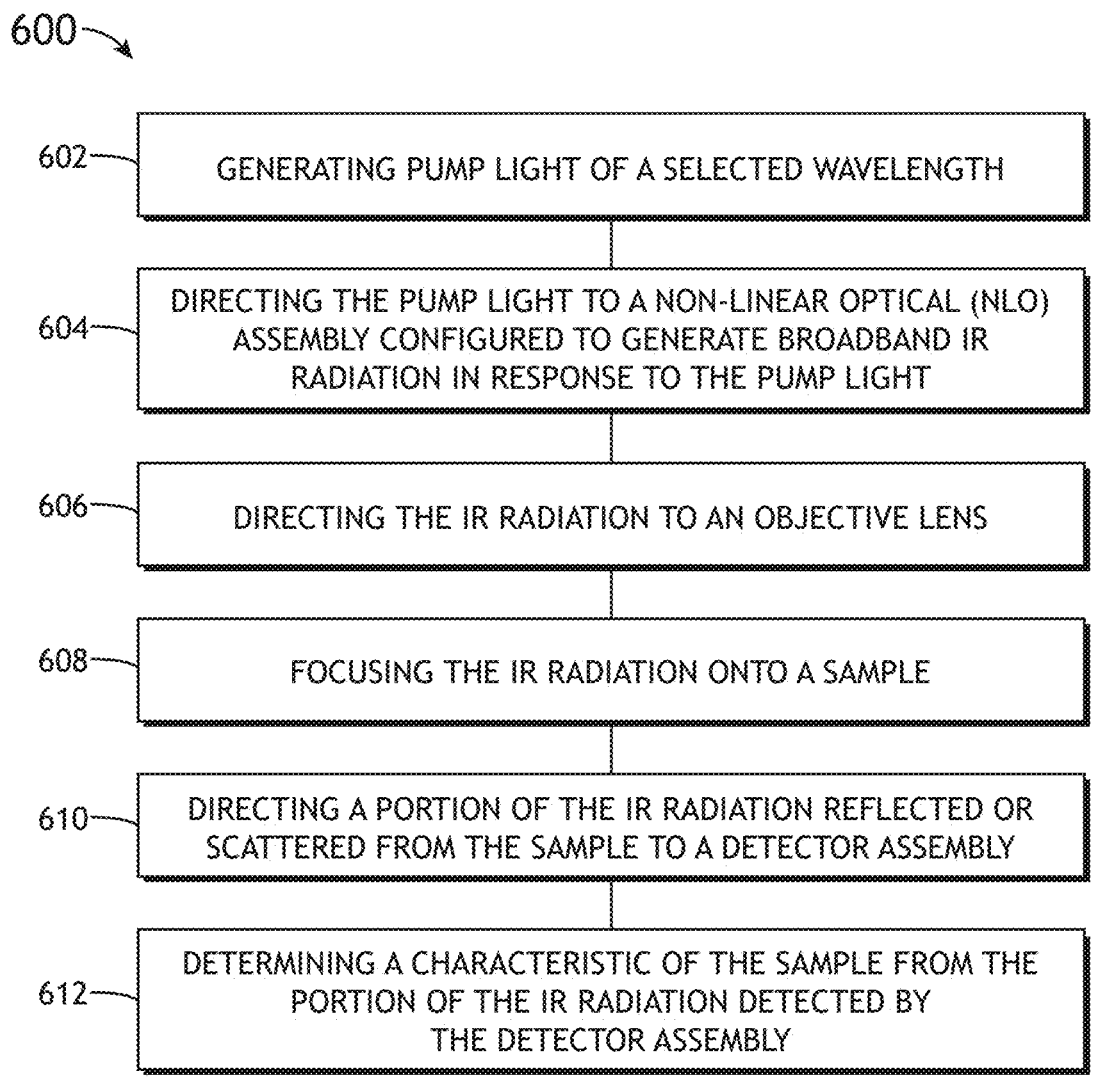
FIG. 6 illustrates a flow diagram of a method for generating broadband infrared radiation, in accordance with one or more embodiments of the present disclosure.

FIG. 6 illustrates a flow diagram of a method 600 for generating broadband infrared radiation, in accordance with one or more embodiments of the present disclosure. It is noted herein that the steps of method 600 may be implemented all or in part by systems 200, 400, 500. It is further recognized, however, that the method 600 is not limited to the systems 200, 400, 500, in that additional or alternative system-level embodiments may carry out all or part of the steps of method 600.

In step 602, pump light of a selected wavelength is generated. In one embodiment, a pump source 102 is configured to generate pump light 101 of various wavelengths including, but not limited to, pump light 101 near 800 nm in wavelength (e.g., a Ti-sapphire laser), pump light 101 near 1 μm in wavelength (e.g., an Nd:YAG, ND-vanadate, YLF or Yb-doped fiber laser), pump light 101 near 1.5 μm in wavelength (e.g., an Er-doped fiber laser), pump light 101 near 2 μm in wavelength (e.g., a Tm-doped fiber laser), and the like.

In step 604, the pump light is directed to a nonlinear optical (NLO) assembly configured to generate broadband IR radiation in response to the pump light. For example, the NLO assembly 104 may comprise one or more optical elements 106, an NLO element 108, and one or more filters 110. By way of another example, NLO assembly 104 may comprise a NLO element 108, one or more optical elements 112, a beam splitter 120, and a set of mirrors. In this regard, the NLO assembly 104 may comprise an OPO. It is noted that the examples given are not to be regarded as limiting the embodiments of the present disclosure.

In step 606, the IR radiation is directed to an objective lens. In step 608, the IR radiation is focused onto a sample. Sample 408 may include any sample known in the art including, but not limited to, a wafer, a reticle, a photomask, and the like. By way of another example, sample 408 may include a stacked semiconductor structure 100. In another embodiment, sample 408 may be disposed on a stage assembly 412 to facilitate the movement of sample 408. Stage 412 may include any stage assembly 412 known in the art including, but not limited to, an X-Y stage or an R-θ stage. In another embodiment, stage assembly 412 may be capable of adjusting the height of sample 408 during inspection to maintain focus on the sample 408.

In step 610, a portion of the IR radiation reflected or scattered from the sample is directed to a detector assembly. For example, a collection arm 405 may include one or more optical elements configured to direct reflected and/or scattered IR radiation to a sensor 416 of a detector assembly 414. It is noted that sensor 416 and detector assembly 414 may include any sensor and detector assembly known in the art. For example, sensor 416 may include a line sensor or an electron-bombarded line sensor.

In step 612, a characteristic of the sample from the portion of IR radiation detected by the detector assembly is determined.

The one or more processors 420, 548 of the present disclosure may include any one or more processing elements known in the art. In this sense, the one or more processors 420, 548 may include any microprocessor-type device configured to execute software algorithms and/or instructions. In one embodiment, the one or more processors 420, 548 may consist of a desktop computer, mainframe computer system, workstation, image computer, parallel processor, or other computer system (e.g., networked computer) configured to execute a program configured to operate the systems 200, 400, 500, as described throughout the present disclosure. It should be recognized that the steps described throughout the present disclosure may be carried out by a single computer system or, alternatively, multiple computer systems. In general, the term "processor" may be broadly defined to encompass any device having one or more processing elements, which execute program instructions from a non-transitory memory medium 422. Moreover, different subsystems of the various systems disclosed may include processor or logic elements suitable for carrying out at least a portion of the steps described throughout the present disclosure. Therefore, the above description should not be interpreted as a limitation on the present disclosure but merely an illustration.

The memory medium 422 may include any storage medium known in the art suitable for storing program instructions executable by the associated one or more processors 420. For example, the memory medium 422 may include a non-transitory memory medium. For instance, the memory medium 422 may include, but is not limited to, a read-only memory, a random access memory, a magnetic or optical memory device (e.g., disk), a magnetic tape, a solid state drive and the like. In another embodiment, the memory 422 is configured to store one or more results and/or outputs of the various steps described herein. It is further noted that memory 422 may be housed in a common controller housing with the one or more processors 420. In an alternative embodiment, the memory 422 may be located remotely with respect to the physical location of the processors 420. For instance, the one or more processors 420 may access a remote memory (e.g., server), accessible through a network (e.g., internet, intranet and the like). In another embodiment, the memory medium 422 maintains program instructions for causing the one or more processors 420 to carry out the various steps described through the present disclosure.

In another embodiment, the systems 200, 400, 500 may include a user interface (not shown). In one embodiment, the user interface is communicatively coupled to the one or more processors 420, 548. In another embodiment, the user interface device may be utilized to accept selections and/or instructions from a user. In some embodiments, described further herein, a display may be used to display data to a user. In turn, a user may input selection and/or instructions (e.g., selection, sizing and/or position of filter box) responsive to data displayed to the user via the display device.

The user interface device may include any user interface known in the art. For example, the user interface may include, but is not limited to, a keyboard, a keypad, a touchscreen, a lever, a knob, a scroll wheel, a track ball, a switch, a dial, a sliding bar, a scroll bar, a slide, a handle, a touch pad, a paddle, a steering wheel, a joystick, a bezel mounted input device or the like. In the case of a touchscreen interface device, those skilled in the art should recognize that a large number of touchscreen interface devices may be suitable for implementation in the present invention. For instance, the display device may be integrated with a touchscreen interface, such as, but not limited to, a capacitive touchscreen, a resistive touchscreen, a surface acoustic based touchscreen, an infrared based touchscreen, or the like. In a general sense, any touchscreen interface capable of integration with the display portion of a display device is suitable for implementation in the present disclosure.

The display device may include any display device known in the art. In one embodiment, the display device may include, but is not limited to, a liquid crystal display (LCD), an organic light-emitting diode (OLED) based display or a CRT display. Those skilled in the art should recognize that a variety of display devices may be suitable for implementation in the present disclosure and the particular choice of display device may depend on a variety of factors, including, but not limited to, form factor, cost, and the like. In a general sense, any display device capable of integration with a user interface device (e.g., touchscreen, bezel mounted interface, keyboard, mouse, trackpad, and the like) is suitable for implementation in the present disclosure.

In some embodiments, the systems 200, 400, 500, as described herein, may be configured as a "stand alone tool" or a tool that is not physically coupled to a process tool. In other embodiments, such an inspection or metrology system may be coupled to a process tool (not shown) by a transmission medium, which may include wired and/or wireless portions. The process tool may include any process tool known in the art such as a lithography tool, an etch tool, a deposition tool, a polishing tool, a plating tool, a cleaning tool, or an ion implantation tool. The results of inspection or measurement performed by the systems described herein may be used to alter a parameter of a process or a process tool using a feedback control technique, a feedforward control technique, and/or an in situ control technique. The parameter of the process or the process tool may be altered manually or automatically.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected", or "coupled", to each other to achieve the desired functionality, and any two components capable of being so associated can also be viewed as being "couplable", to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A system comprising:
    an illumination source, wherein the illumination source comprises a broadband light source assembly, wherein the broadband light source assembly comprises:
        a pump source configured to generate pump light of a selected wavelength; and
        a nonlinear optical (NLO) assembly configured to generate broadband infrared (IR) radiation in response to the pump light generated by the pump source, wherein the NLO assembly includes a nonlinear optical crystal configured to generate the broadband IR radiation including a full-width half maximum bandwidth of at least 1.5 µm;
    a detector assembly; and
    a set of optics configured to direct the IR radiation beneath a top hard mask surface of a stacked semiconductor structure, wherein the set of optics is further configured to direct a portion of the IR radiation from one or more portions of the stacked semiconductor structure beneath the top hard mask surface of the stacked semiconductor structure to one or more sensors of the detector assembly, wherein the set of optics includes one or more confocal apertures positioned within at least one of an illumination arm or collection arm of the set of optics, wherein the one or more confocal apertures are configured to provide depth resolution within the stacked semiconductor structure; and
    a controller communicatively coupled to the one or more sensors of the detector assembly and the one or more confocal apertures, the controller including one or more processors configured to execute a set of program instructions stored in memory, the set of program instructions configured to cause the one or more processors to:
        receive one or more signals from the one or more sensors of the detector assembly indicative of IR radiation from one or more portions of the stacked semiconductor structure beneath the top hard mask surface of the stacked semiconductor structure;
adjust the one or more confocal apertures; and
characterize a feature located multiple microns below the top hard mask surface of the stacked semiconductor structure based on the received one or more signals.

2. The system of claim 1, wherein the pump source comprises a laser, and wherein the NLO assembly comprises a NLO crystal and one or more optical elements.

3. The system of claim 1, wherein the pump source comprises a laser, and wherein the NLO assembly comprises an optical parametric oscillator (OPO) assembly.

4. The system of claim 1, wherein the pump source comprises a laser, an NLO crystal, and one or more optical elements, and wherein the NLO assembly comprises an optical parametric oscillator (OPO) assembly.

5. The system of claim 1, wherein the pump source comprises a laser and a first optical parametric oscillator (OPO) assembly, and wherein the NLO assembly comprises a second OPO assembly.

6. The system of claim 1, wherein the NLO assembly is configured to generate broadband IR radiation centered on a wavelength of approximately two times a fundamental wavelength of the pump source.

7. The system of claim 1, wherein the NLO assembly is configured to generate broadband IR radiation including a wavelength range from about 1 µm to about 3 µm.

8. The system of claim 1, wherein the NLO assembly is configured to generate broadband IR radiation including a wavelength range from about 2 µm to about 5 µm.

9. The system of claim 1, wherein the NLO assembly is configured to generate broadband IR radiation including a FWHM bandwidth of at least 3 µm.

10. The system of claim 1, wherein the NLO assembly comprises one of periodically poled lithium niobate (PPLN), stoichiometric lithium tantalate (SLT), magnesium-doped SLT, and orientation-patterned gallium arsenide.

11. The system of claim 1, wherein the set of optics is further configured to direct polarized IR radiation to the sample.

12. The system of claim 1, wherein the pump source is configured to generate pump light with a wavelength of 3.3 µm, and wherein the NLO assembly comprises a GaAs optical parametric oscillator (OPO) assembly.

13. The system of claim 1, wherein the pump source is configured to generate pump light with a wavelength of 960 nm, and wherein the NLO assembly comprises a PPLN optical parametric oscillator (OPO) assembly.

14. The system of claim 1, wherein the set of optics is further configured to collect and analyze a polarization state of IR radiation reflected or scattered from the sample.

15. A method comprising:
generating pump light of a selected wavelength;
directing the pump light to a nonlinear optical (NLO) assembly configured to generate broadband IR radiation in response to the pump light, wherein the NLO assembly includes a non-linear optical crystal configured to generate the broadband IR radiation including a full-width half maximum bandwidth of at least 1.5 µm;
directing and focusing the IR radiation beneath a top hard mask surface of a stacked semiconductor structure;
directing a portion of the IR radiation reflected or scattered from one or more portions of the stacked semiconductor structure beneath the top hard mask surface of the stacked semiconductor structure to a detector assembly;
adjusting one or more characteristics of one or more confocal apertures located within at least one of an illumination arm or a collection arm to provide depth resolution within the stacked semiconductor structure; and
characterizing a feature located multiple microns below a top hard mask surface of the stacked semiconductor structure based on the IR radiation reflected or scattered from the one or more portions of the stacked semiconductor structure beneath the top hard mask surface of the stacked semiconductor structure.

16. The method of claim 15, wherein the generating broadband IR radiation generates radiation having a spectral range from about 1 µm to about 3 µm.

17. The method of claim 15, wherein the generating broadband IR radiation generates radiation having a spectral range from about 2 µm to about 5 µm.

18. The method of claim 15, wherein the NLO assembly is configured to generate broadband IR radiation including a FWHM bandwidth of at least 3 µm.

19. The method of claim 15, wherein the NLO assembly includes an NLO crystal, wherein the NLO crystal comprises one of periodically poled lithium niobate (PPLN), stoichiometric lithium tantalate (SLT), magnesium-doped SLT, and orientation-patterned gallium arsenide.

20. The method of claim 15, wherein the focusing focuses polarized IR radiation to the sample.

21. The method of claim 15, wherein the computing a characteristic of the sample from the portion of IR radiation detected by the detector assembly comprises analyzing a polarization state of the IR radiation.

22. The method of claim 15, wherein the generating pump light of a selected wavelength comprises:
generating pump light with a wavelength of 3.3 µm, and wherein the NLO assembly comprises a GaAS optical parametric oscillator (OPO) assembly.

23. The method of claim 15, wherein the generating pump light of a selected wavelength comprises:
generating pump light with a wavelength of 960 nm, and wherein the NLO assembly comprises a PPLN optical parametric oscillator (OPO) assembly.

* * * * *